(12) United States Patent
Kim et al.

(10) Patent No.: US 11,538,879 B2
(45) Date of Patent: Dec. 27, 2022

(54) DISPLAY DEVICE HAVING FIRST TRANSISTOR, SECOND TRANSISTOR, AND THIRD TRANSISTOR DISPOSED ON DIFFERENT LAYERS

(71) Applicant: Samsung Display Co., LTD., Yongin-si (KR)

(72) Inventors: June Hwan Kim, Daejeon (KR); Tae Young Kim, Seongnam-si (KR); Jong Woo Park, Seongnam-si (KR); Ki Ju Im, Suwon-si (KR); Ji Ho Moon, Hwaseong-si (KR); Hyun Cheol Hwang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 76 days.

(21) Appl. No.: 16/952,787

(22) Filed: Nov. 19, 2020

(65) Prior Publication Data

US 2021/0249491 A1    Aug. 12, 2021

(30) Foreign Application Priority Data

Feb. 12, 2020   (KR) .......................... 10-2020-0016878

(51) Int. Cl.
*H01L 29/08*   (2006.01)
*H01L 27/32*   (2006.01)
(Continued)

(52) U.S. Cl.
CPC ....... *H01L 27/3262* (2013.01); *G09G 3/3233* (2013.01); *H01L 27/3265* (2013.01); *H01L 27/3276* (2013.01); *H01L 51/56* (2013.01); *G09G 2300/0809* (2013.01); *H01L 27/124* (2013.01); *H01L 27/127* (2013.01); *H01L 27/1222* (2013.01); *H01L 27/1255* (2013.01);
(Continued)

(58) Field of Classification Search
CPC ............ H01L 27/3262; H01L 27/3265; H01L 27/3276; G09G 3/3233
USPC ......................................................... 257/40
See application file for complete search history.

(56) References Cited

U.S. PATENT DOCUMENTS 8,923,048 B2   12/2014 Rabkin et al.
9,768,202 B2   9/2017 Lv et al.
(Continued)

FOREIGN PATENT DOCUMENTS

KR         10-1905717      11/2018
KR     10-2019-0079828      7/2019

*Primary Examiner* — Phuc T Dang
(74) *Attorney, Agent, or Firm* — Kile Park Reed & Houtteman PLLC

(57) ABSTRACT

A display device includes an organic light emitting diode, a first transistor driving the organic light emitting diode, a second transistor transmitting a data signal to the first transistor, a third transistor transmitting a first power voltage to the first transistor, wherein a semiconductor pattern of the first transistor is disposed over a semiconductor pattern of the second transistor, a semiconductor pattern of the third transistor is disposed over the semiconductor pattern of the first transistor, a lower transistor insulating film is disposed between the semiconductor pattern of the first transistor and the semiconductor pattern of the second transistor, and an upper transistor insulating film is disposed between the semiconductor pattern of the first transistor and the semiconductor pattern of the third transistor.

17 Claims, 28 Drawing Sheets

(51) Int. Cl.
*G09G 3/3233* (2016.01)
*H01L 51/56* (2006.01)
*H01L 29/66* (2006.01)
*H01L 27/12* (2006.01)
*H01L 29/786* (2006.01)

(52) U.S. Cl.
CPC .. *H01L 29/66757* (2013.01); *H01L 29/78675* (2013.01); *H01L 2227/323* (2013.01)

(56) References Cited

U.S. PATENT DOCUMENTS

| | | |
|---|---|---|
| 9,983,265 B2 | 5/2018 | Kurokawa |
| 10,388,710 B2 | 8/2019 | Lee et al. |
| 2013/0272069 A1 | 10/2013 | Rabkin et al. |
| 2016/0247836 A1 | 8/2016 | Lv et al. |
| 2016/0322445 A1* | 11/2016 | Lee .................... H01L 27/3265 |
| 2017/0124953 A1* | 5/2017 | Shim .................... H01L 27/3265 |
| 2018/0212014 A1* | 7/2018 | Choi .................... H01L 27/3272 |
| 2018/0240855 A1 | 8/2018 | Lee et al. |
| 2019/0198534 A1* | 6/2019 | Je ........................ H01L 27/1225 |

\* cited by examiner

DISPLAY DEVICE HAVING FIRST TRANSISTOR, SECOND TRANSISTOR, AND THIRD TRANSISTOR DISPOSED ON DIFFERENT LAYERS

CROSS-REFERENCE TO RELATED APPLICATION(S)

This application claims priority to and benefits of Korean Patent Application No. 10-2020-0016878 under 35 U.S.C. § 119, filed in the Korean Intellectual Property Office on Feb. 12, 2020, the entire contents of which are incorporated herein by reference.

BACKGROUND

1. Technical Field

The invention relates to a display device.

2. Description of the Related Art

With the development of information society, requirements for display devices for displaying images have increased in various forms. For example, display devices are applied to various electronic appliances such as smart phones, digital cameras, notebook computers, navigators, and smart televisions. A display device may be a flat panel display device such as a liquid crystal display device, a field emission display device, or a light emitting display device. Since the light emitting display device, among flat panel display devices, includes light emitting elements by which each of the pixels in a display panel emits light by itself, it may display an image without a backlight unit providing light to the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the invention may be to provide a display device capable of realizing high resolution by highly integrating semiconductor elements for driving light emitting elements.

Another aspect of the invention may be to provide a method of manufacturing a display device capable of realizing high resolution by highly integrating semiconductor elements for driving light emitting elements.

However, aspects of the invention are not restricted to those set forth herein. The above and other aspects of the invention will become more apparent to one of ordinary skill in the art to which the invention pertains by referencing the detailed description of the embodiments given below.

An embodiment of a display device may include an organic light emitting diode, a first transistor that receives a data signal from a data line and controls a driving current to drive the organic light emitting diode, a second transistor electrically connected to the data line and a first source or drain electrode of the first transistor, the second transistor transmitting the data signal received from the data line to the first transistor, a third transistor electrically connected to a first power voltage line and the first source or drain electrode of the first transistor, the third transistor transmitting a first power voltage from the first power voltage line to the first transistor. A semiconductor pattern of the first transistor may be disposed over a semiconductor pattern of the second transistor, and a semiconductor pattern of the third transistor may be disposed over the semiconductor pattern of the first transistor. The display device may also include a lower transistor insulating film disposed between the semiconductor pattern of the first transistor and the semiconductor pattern of the second transistor, and an upper transistor insulating film disposed between the semiconductor pattern of the first transistor and the semiconductor pattern of the third transistor.

The display device may further include a fourth transistor electrically connected to a gate electrode and a second source or drain electrode of the first transistor, wherein a semiconductor pattern of the fourth transistor may be disposed between the semiconductor pattern of the second transistor and the semiconductor pattern of the third transistor.

The display device may further include a sub-gate insulating film overlapping the gate electrode of the first transistor and not overlapping a gate electrode of the fourth transistor, wherein a thickness between the gate electrode of the first transistor and a channel region may be greater than a thickness between the gate electrode of the fourth transistor and a channel region.

The display device may further include a fifth transistor electrically connected to the gate electrode of the first transistor and an initialization line, the fifth transistor transmitting an initialization voltage from the initialization line to the first transistor, wherein a semiconductor pattern of the fifth transistor may be disposed under the semiconductor patter of the first transistor.

The display device may further include a sixth transistor electrically connected to a second source or drain electrode of the first transistor and an anode electrode of the organic light emitting diode, the sixth transistor transmitting the driving current from the first transistor to the organic light emitting diode, wherein a semiconductor pattern of the sixth transistor may be disposed over the semiconductor patter of the first transistor.

The semiconductor pattern of the first transistor, the semiconductor pattern of the second transistor, and the semiconductor pattern of the third transistor may include a same material.

The semiconductor pattern of the first transistor, the semiconductor pattern of the second transistor, and the semiconductor pattern of the third transistor may constitute a PMOS transistor including polycrystalline silicon.

The display device may further include a capacitor including a first electrode electrically connected to the gate electrode of the first transistor, and a second electrode electrically connected to the first power voltage line, wherein the capacitor may be disposed between the semiconductor pattern of the first transistor and the semiconductor pattern of the third transistor.

The lower transistor insulating film may include a first interlayer insulating film disposed over the semiconductor pattern of the second transistor, and an upper surface of the first interlayer insulating film may be substantially flat.

The upper transistor insulating film may include a second interlayer insulating film disposed over the semiconductor pattern of the first transistor, and an upper surface of the second interlayer insulating film may be substantially flat.

The display device may further include a first contact pattern disposed between the semiconductor pattern of the first transistor and the semiconductor pattern of the second transistor, wherein the semiconductor pattern of the first transistor and the semiconductor pattern of the second transistor may be electrically connected through the first contact pattern.

The display device may further include a second contact pattern disposed between the semiconductor pattern of the first transistor and the semiconductor pattern of the third transistor, wherein the semiconductor pattern of the first transistor and the semiconductor pattern of the third transistor may be electrically connected through the second contact pattern.

An embodiment of a display device may include a first transistor, a second transistor, and a third transistor disposed on different layers, respectively, a capacitor, a first semiconductor layer disposed over a substrate and including a semiconductor pattern of the first transistor, a first gate insulating film disposed over the first semiconductor layer, a first conductive layer disposed over the first gate insulating film and including a gate electrode of the first transistor, a first interlayer insulating film disposed over the first conductive layer, a second semiconductor layer disposed over the first interlayer insulating film and including a semiconductor pattern of the second transistor, a second gate insulating film disposed over the second semiconductor layer, a second conductive layer disposed over the second gate insulating film and including a gate electrode of the second transistor and a first electrode of the capacitor electrically connected to the gate electrode of the second transistor. The display device may also include a second interlayer insulating film disposed over the second conductive layer, a third conductive layer including a second electrode of the capacitor disposed over the second interlayer insulating film, a third interlayer insulating film disposed over the third conductive layer, a third semiconductor layer disposed over the third interlayer insulating film and including a semiconductor pattern of the third transistor, a third gate insulating film disposed over the third semiconductor layer, and a fourth conductive layer disposed over the third gate insulating film and including a gate electrode of the third transistor.

The second semiconductor layer may be disposed on an upper surface of the first interlayer insulating film, and the upper surface of the first interlayer insulating film may be substantially flat.

The display device may further include a first contact pattern disposed in a first contact hole penetrating the first interlayer insulating film, wherein an upper surface of the first contact pattern and the upper surface of the first interlayer insulating film may be disposed on a same plane.

The third semiconductor layer may be disposed on an upper surface of the third interlayer insulating film, and the upper surface of the third interlayer insulating film may be substantially flat.

The display device may further include a second contact pattern disposed in a second contact hole penetrating the third interlayer insulating film, the second interlayer insulating film and the second gate insulating film, wherein an upper surface of the second contact pattern and the upper surface of the third interlayer insulating film may be disposed on a same plane.

An embodiment of a method of manufacturing a display device including a first transistor, a second transistor, and a third transistor disposed on different layers, respectively, may include forming a first semiconductor layer on a substrate, the first semiconductor layer including a semiconductor pattern of the first transistor, forming a first gate insulating film on the first semiconductor layer, forming a first conductive layer on the first gate insulating film, the first conductive layer including a gate electrode of the first transistor, forming a first interlayer insulating film on the first conductive layer, forming an upper surface of the first interlayer insulating film substantially flat, forming a second semiconductor layer on the upper surface of the first interlayer insulating film, the second semiconductor layer including a semiconductor pattern of the second transistor, forming a second gate insulating film on the second semiconductor layer, forming a second conductive layer on the second gate insulating film, the second conductive layer including a gate electrode of the third transistor and a first electrode of a capacitor electrically connected to the gate electrode of the third transistor, forming a second interlayer insulating film on the second conductive layer, forming a third conductive layer on the second interlayer insulating film, the third conductive layer including a second electrode of the capacitor, forming a third interlayer insulating film on the third conductive layer, forming a third semiconductor layer on the third interlayer insulating film, the third semiconductor layer including a semiconductor pattern of the third transistor, forming a third gate insulating film on the third semiconductor layer, and forming a fourth conductive layer on the third gate insulating film, the fourth conductive layer including a gate electrode of the third transistor.

The method may further include forming an upper surface of the third interlayer insulating film substantially flat before the forming of the third semiconductor layer, wherein the third semiconductor layer may be disposed over the upper surface of the third interlayer insulating film.

Each of the first semiconductor layer, the second semiconductor layer, and the third semiconductor layer may include polycrystalline silicon, and each of the first transistor, the second transistor, and the third transistor may be a PMOS transistor.

There may be provided a display device capable of realizing high resolution by highly integrating semiconductor elements for driving light emitting elements.

There may be provided a method of manufacturing a display device capable of realizing high resolution by highly integrating semiconductor elements for driving light emitting elements.

The effects of the invention are not limited by the foregoing, and other various effects are anticipated herein.

BRIEF DESCRIPTION OF THE DRAWINGS

The above and other aspects and features of the invention will become more apparent by describing in detail embodiments thereof with reference to the attached drawings, in which.

DETAILED DESCRIPTION OF THE EMBODIMENTS

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on another layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The term "overlap" may include layer, stack, face or facing, extending over, extending under, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Figure 1:
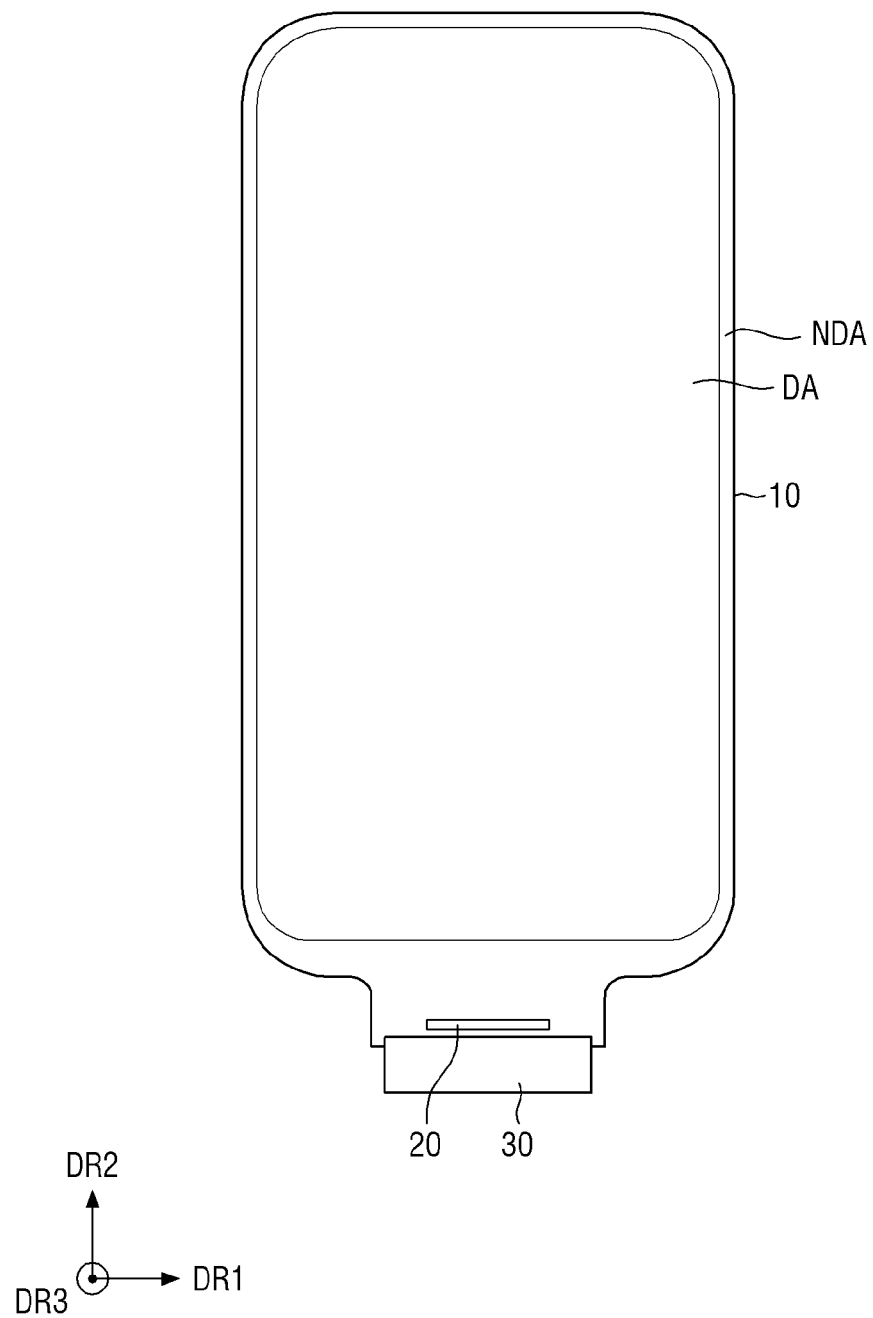
FIG. 1 is a schematic view of a display device according to an embodiment.
Figure 2:
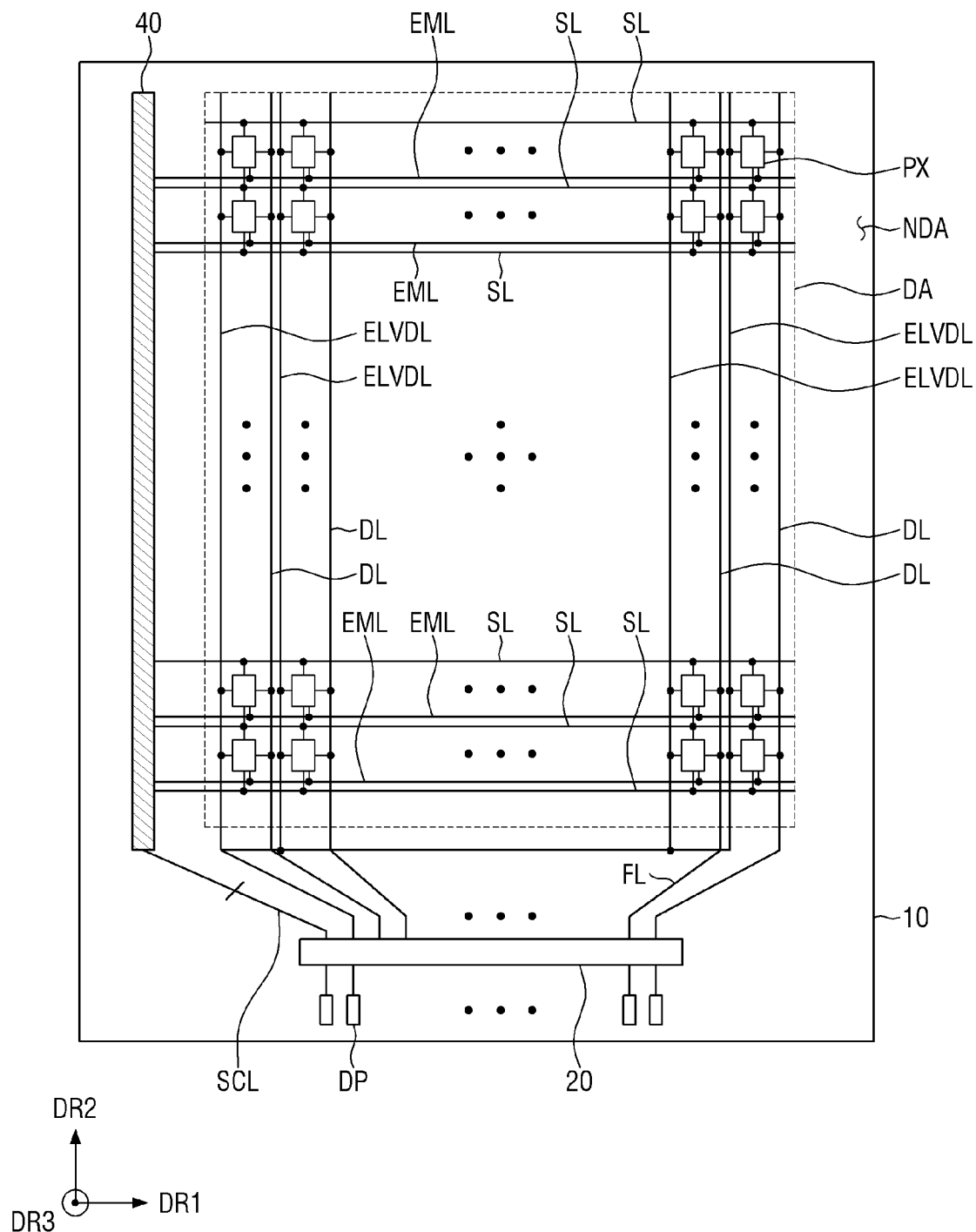
FIG. 2 is a schematic plan view of a display device according to an embodiment.
Figure 3:
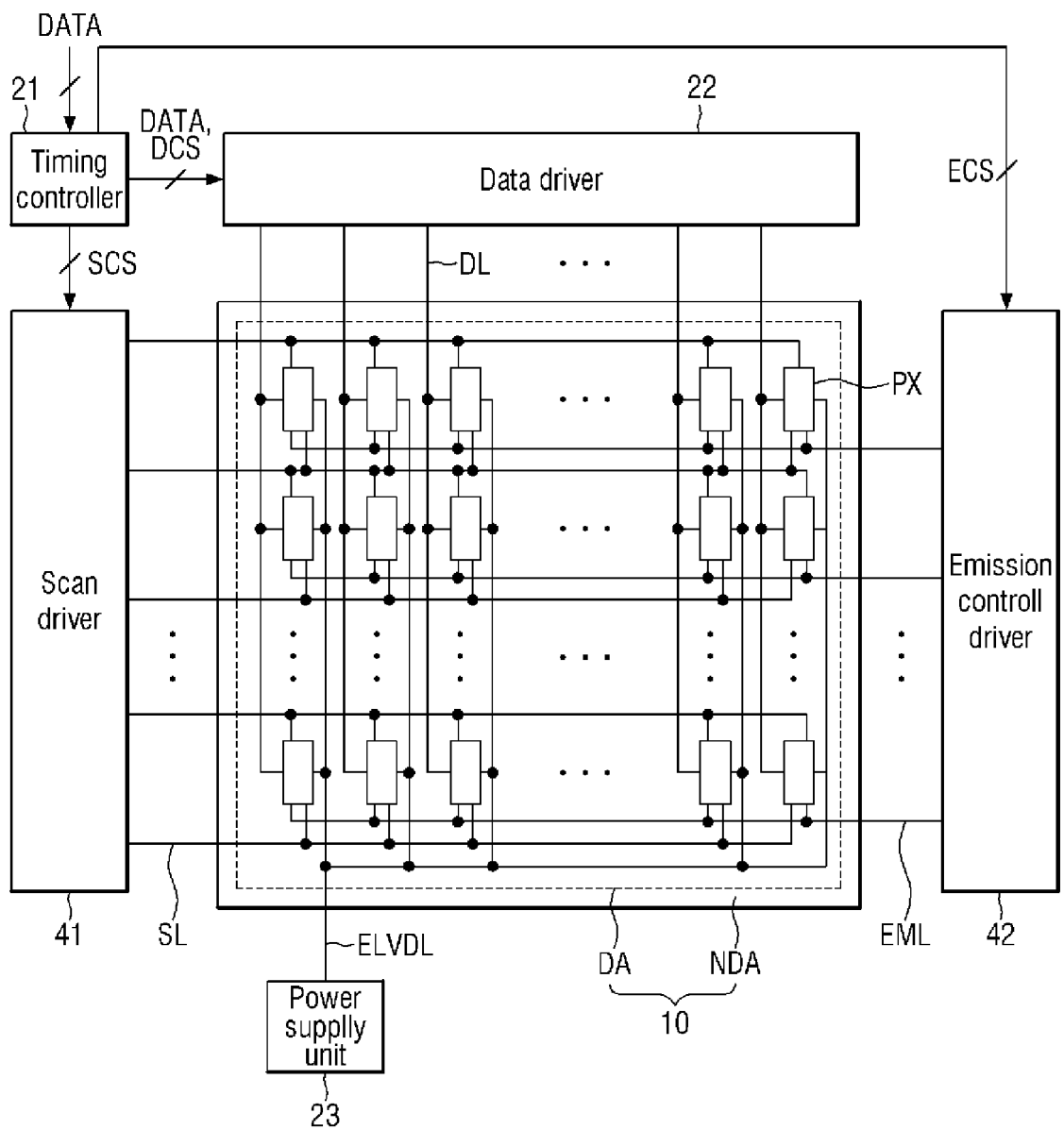
FIG. 3 is a schematic block diagram of a display device according to an embodiment.

FIG. 1 is a schematic view of a display device according to an embodiment, FIG. 2 is a schematic plan view of a display device according to an embodiment, and FIG. 3 is a schematic block diagram of a display device according to an embodiment.

In the drawings, the first direction DR1 indicates a horizontal direction of the display device 1 in a plan view, and the second direction DR2 indicates a vertical direction of the display device 1 in a plan view. The third direction DR3 indicates a thickness direction of the display device 1. The first direction DR1 and the second direction DR2 intersect each other in a direction perpendicular to each other, and the third direction DR3 intersects both the first direction DR1 and the second direction DR2 in a direction intersecting the plane in which the first direction DR1 and the second direction DR2 lie. However, the directions mentioned in embodiments should be understood as mentioning relative directions, and the embodiments are not limited to the mentioned directions.

Unless otherwise defined, as used herein, "upper portion", "upper surface", and "upper side" expressed based on the third direction DR3 mean a side of a display surface based on the display panel 10, and "lower portion", "lower surface", and "lower side" expressed based on the third direction DR3 mean an opposite side of a display surface based on the display panel 10.

The display device 1, which may be a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 1 according to an embodiment may be formed in a substantially rectangular shape on a plane. The display device 1 may have a rectangular shape with vertical corners on a plane. However, the invention is not limited thereto, and the display device 1 may have a rectangular shape with rounded corners on a plane.

The display panel 10 may be an organic light emitting display panel. In the following embodiments, a case where an organic light emitting display panel may be applied as the display panel 10 is illustrated, but the invention is not limited thereto, and different kinds of display panels such as a liquid crystal display (LCD) panel, a quantum dot organic light emitting display (QD-OLED) panel, a quantum dot liquid crystal display (QD-LCD) panel, a quantum nano light emitting display panel (nano NED), and a micro light emitting diode (LED) may be applied. Hereinafter, the display device 10 will be described as an organic light emitting display device, but the invention is not limited thereto.

The display panel 10 may include a display area DA in which pixels PX may be formed to display an image, and a non-display area NDA that may be a peripheral area of the display area DA. The display area DA may have a rectangular shape with vertical corners or a rectangular shape with rounded corners. The display area DA may have short sides and long sides. The short sides of the display area DA may be sides extending in the first direction DR1. The long sides of the display area DA may be sides extending in the second direction DR2. However, the planar shape of the display area DA is not limited to a rectangle, and may have a circular shape, an elliptical shape, or other various shapes.

In the display area, not only may pixels PX be arranged, but also scan lines SL, emission control lines EML, data lines DL, and first power voltage lines ELVDL, which may be electrically connected to the pixels PX. The scan lines SL and the emission control lines EML may be arranged in parallel in the first direction DR1. The data lines DL may be arranged in parallel in the second direction DR2 crossing the first direction DR1. The first power voltage lines ELVDL may be arranged in parallel in the second direction DR2 in the display area DA. The first power voltage lines ELVDL arranged in parallel in the second direction DR2 in the display area DA may be electrically connected to each other in the non-display area NDA.

Each of the pixels PX may be electrically connected to at least one of the scan lines SL, at least one of the data lines DL, at least one of the emission control lines EML, and the first power voltage line ELVDL. Although it is shown in FIG. 2 that each of the pixels PX may be electrically connected to two scan lines SL, one data line DL, one emission control line EML, and the first power voltage line ELVDL, the invention is not limited thereto. For example, each of the pixels PX may be electrically connected to three scan lines SL instead of two scan lines SL.

The non-display area NDA may be defined as an area from the outside of the display area DA to the edge of the display panel 10. For example, the non-display area NDA may be disposed to surround the display area DA, and may constitute a bezel.

The non-display area NDA may be provided with a scan driving circuit 40 for applying scan signals to the scan lines SL, fan-out lines FL between the data lines DL and a display driving circuit 20, and pads DP electrically connected to the display driving circuit 20. The display driving circuit 20 and the pads DP may be disposed at one side edge of the display panel 10. The pads DP may be disposed adjacent to one side edge of the display panel 10 rather than the display driving circuit 20.

The scan driving circuit 40 may be electrically connected to the display driving circuit 20 through scan control lines SCL. The scan driving circuit 40 may receive a scan control signal SCS and an emission control signal ECS from the display driving circuit 20 through the scan control lines SCL.

As shown in FIG. 3, the scan driving circuit 40 may include a scan driver 41 and an emission control driver 42.

The scan driver 41 may generate scan signals according to the scan control signal SCS, and may sequentially output the scan signals to the scan lines SL. The emission control driver 42 may generate emission control signals according to the emission control signal ECS, and may sequentially output the emission control signals to the emission control lines EML.

The scan driving circuit 40 may include thin film transistors. The scan driving circuit 40 may be formed on the same layer as the thin film transistors of the pixels PX. Although it is shown in FIG. 2 that the scan driving circuit 40 may be formed in the non-display area NDA located at one side, for example, left side of the display area DA, the invention is not limited thereto. For example, the scan driving circuit 40 may be formed in the non-display area NDA located at both sides, for example, left and right sides of the display area DA.

As shown in FIG. 3, the display driving circuit 20 may include a timing controller 21, a data driver 22, and a power supply 23.

The timing controller 21 may receive digital video data DATA and timing signals from a circuit board 30. The timing controller 21 may generate a scan control signal SCS for controlling the operation timing of the scan driver 41 according to the timing signals, may generate an emission control signal ECS for controlling the operation timing of the emission control driver 42, and may generate a data control signal DCS for controlling the operation timing of the data driver 22. The timing controller 21 may output the scan control signal SCS to the scan driver 41 through the scan control lines SCL, and may output the emission control signal ECS to the emission control driver 42. The timing controller 21 may output the digital video data DATA and the data control signal DCS to the data driver 22.

The data driver 22 may convert the digital video data DATA into analog positive polarity and negative polarity data voltages and output these data voltages to the data lines DL through the fan-out lines FL. The pixels PX may be selected by the scan signals of the scan driving circuit 40, and the data voltages may be supplied to the selected pixels PX.

The power supply 23 may generate a first power voltage ELVDD and supply the first power voltage ELVDD to the first power, voltage line ELVDL. Further, the power supply 23 may generate a second power voltage ELVSS and supply the second power voltage ELVSS (see, e.g., ELVSL) to a second source/drain electrode (refer to 'CAT' in FIG. 5) of the organic light emitting diode (refer to 'OLED' in FIG. 4) of each of the pixels PX. The first power voltage ELVDD may be a high-potential voltage for driving the organic light emitting diode (refer to 'OLED' in FIG. 4), and the second power voltage ELVSS may be a low-potential voltage for driving the organic light emitting diode (refer to "OLED" in FIG. 4). For example, the first power voltage ELVDD may have a higher potential than the second power voltage ELVSS.

The display driving circuit 20 may be formed as an integrated circuit (IC), and may be attached onto the display panel 10 by a chip on glass (COG) method, a chip on plastic (COP) method, or an ultrasonic bonding method. However, the invention is not limited thereto. For example, the display driving circuit 20 may be attached onto the circuit board 30.

The circuit board 30 may be attached onto the pads DP using an anisotropic conductive film. Thus, lead lines of the circuit board 30 may be electrically connected to the pads DP. The circuit board 30 may be a flexible film such as a flexible printed circuit board, a printed circuit board, or a chip on film.

Figure 4:
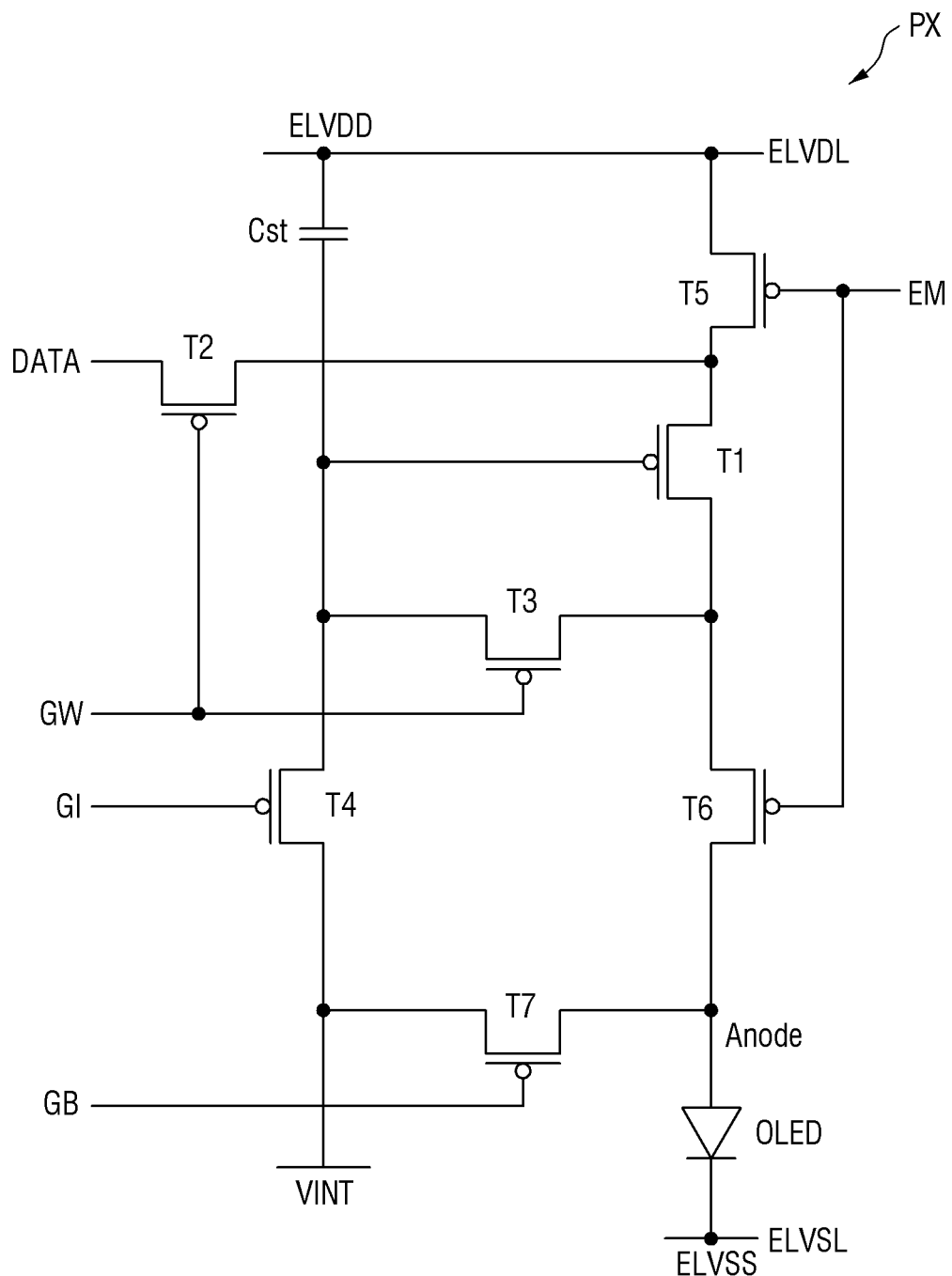
FIG. 4 is a schematic circuit diagram of a pixel according to an embodiment.

FIG. 4 is a schematic circuit diagram of a pixel according to an embodiment.

Referring to FIG. 4, the circuit of the pixel PX may include transistors T1 to T7, a capacitor Cst, and a light emitting element OLED, and the like. A data signal DATA, a first scan signal GW, a second scan signal GI, a third scan signal GB, an emission control signal EM, a first power voltage ELVDD, a second power voltage ELVSS and an initialization voltage VINT may be applied to the circuit of the pixel PX.

Figure 5:
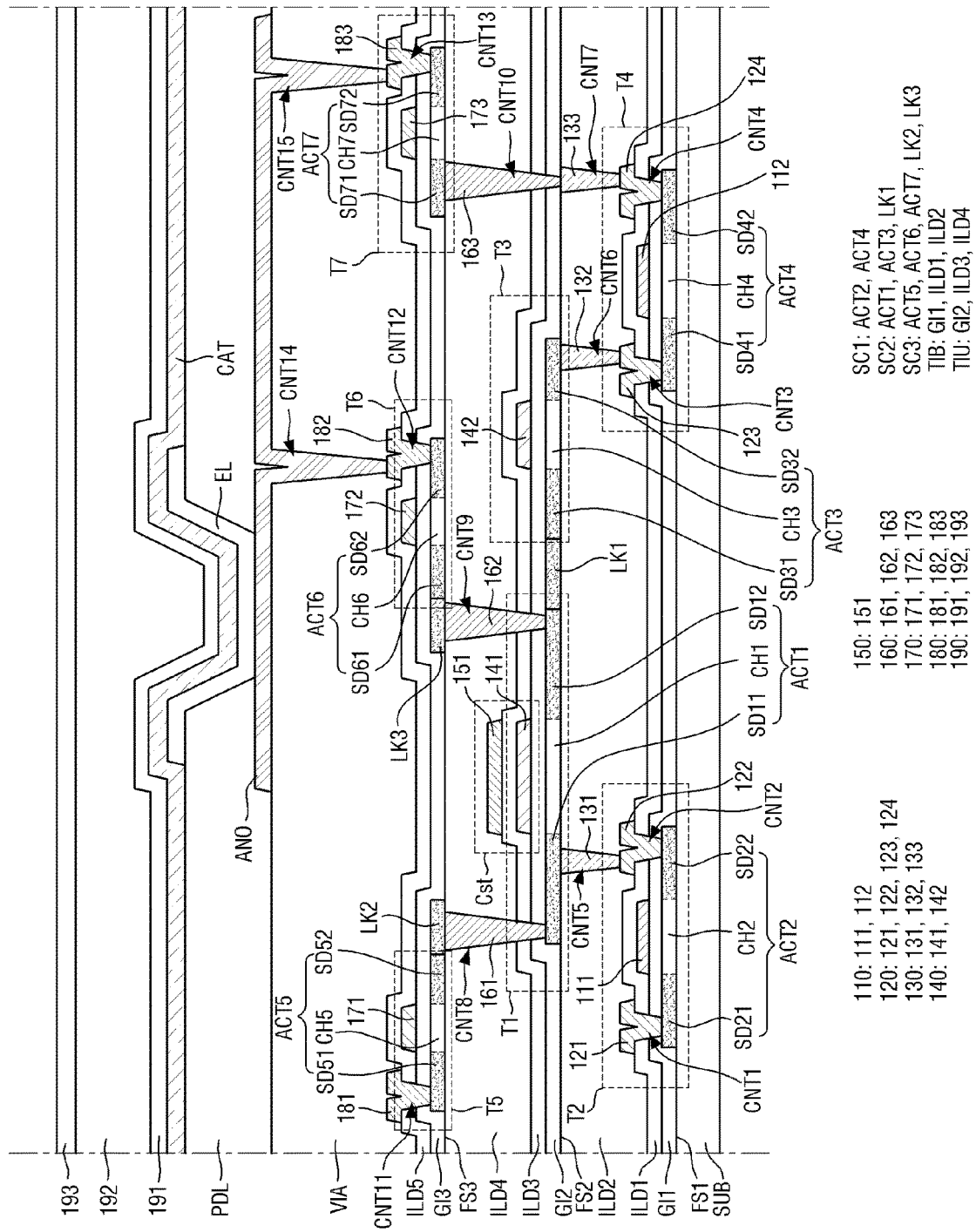
FIG. 5 is a schematic cross-sectional view of a pixel according to an embodiment.

The light emitting element OLED may be an organic light emitting diode including a first source/drain electrode (or an anode electrode, refer to 'ANO' in FIG. 5), an organic light emitting layer (refer to 'EL' in FIG. 5), and a second source/drain electrode (or a cathode, refer to 'CAT' in FIG. 5).

The first transistor T1 may serve as a driving transistor, and the second to seventh transistors T2 to T7 may serve as switching transistors. Each of the transistors T1 to T7 may include a gate electrode, a first source/drain electrode, and a second source/drain electrode. One of the first source/drain electrode and the second source/drain electrode of each of the transistors T1 to T7 may be a source electrode, and another thereof may be a drain electrode.

Each of the transistors T1 to T7 may be a thin film transistor. Each of the transistors T1 to T7 may be any one of a PMOS transistor or an NMOS transistor. In an embodiment, the first transistor T1 as a driving transistor, the second transistor T2 as a data transfer transistor, the third transistor T3 as a compensation transistor, the fourth transistor T4 as a first initialization transistor, the fifth transistor T5 as a first light emission control transistor, the sixth transistor T6 as a second light emission control transistor, and the seventh transistor T7 as a second initialization transistor may be all PMOS transistors.

Although it is shown in FIG. 4 that each of the pixels PX may be a 7T1C (7Transistor-1Capacitor) structure having seven transistors T1 to T7 and one capacitor Cst, the invention is not limited thereto. Each of the pixels PX may include transistors and capacitors. For example, various other modified pixel PX structures such as a 2T1C structure, a 3T1C structure, and a 6T1C structure may be applied to each of the pixels PX.

Hereinafter, each component will be described in detail.

The gate electrode of the first transistor T1 may be electrically connected to a first electrode of the capacitor Cst. The first source/drain electrode of the first transistor T1 may be electrically connected to a first power voltage ELVDD terminal through the fifth transistor T5. The second source/drain electrode of the first transistor T1 may be electrically connected to the anode electrode (refer toe 'ANO' in FIG. 5) of the light emitting element OLED through the sixth transistor T6. The first transistor T1 may receive the data signal DATA according to the switching operation of the second transistor T2 and supply a driving current to the light emitting element OLED.

The first transistor T1 may control a drain-source current Ids (hereinafter referred to as "driving current") according to the data voltage applied to the gate electrode. The driving current Ids flowing through the channel of the first transistor T1 may be proportional to a square of a difference between a gate-source voltage Vsg and a threshold voltage Vth of the first transistor T1 as shown in Equation 1 below.

$$Ids = k' \times (Vgs - Vth)^2 \quad \text{[Equation 1]}$$

In Equation 1, k' refers to a proportional coefficient determined by the structure and physical characteristics of the driving transistor, Vgs refers to a gate-source voltage of the driving transistor, and Vth refers to a threshold voltage of driving transistor.

The gate electrode of the second transistor T2 may be electrically connected to a first scan signal GW terminal. The first source/drain electrode of the second transistor T2 may be electrically connected to a data signal DATA terminal. The second source/drain electrode of the second transistor T2 may be electrically connected to the first source/drain electrode of the first transistor T1, and electrically connected to a first power voltage ELVDD terminal through the fifth transistor T5. The second transistor T2 may be turned on according to the first scan signal GW to perform a switching operation of transmitting the data signal DATA to the first source/drain electrode of the first transistor T1.

The gate electrode of the third transistor T3 may be electrically connected to the first scan signal GW terminal, the first source/drain electrode thereof may be electrically connected to the second source/drain electrode of the first transistor T1 and the first source/drain electrode of the sixth transistor T6, and the second source/drain electrode thereof may be electrically connected to the first electrode of the capacitor Cst, the first source/drain electrode of the fourth transistor T4, and the gate electrode of the first transistor T1.

The third transistor T3 may be turned on by the first scan signal GW to connect the gate electrode and the second source/drain electrode of the first transistor T1 to diode-connect the first transistor T1. Thus, a voltage difference may be generated between the first source/drain electrode and the gate electrode of the first transistor T1 by the threshold voltage of the first transistor T1, and the data signal DATA having compensated threshold voltage may be supplied to the gate electrode of the first transistor T1, thereby compensating for the threshold voltage deviation of the first transistor T1.

The gate electrode of the fourth transistor T4 may be electrically connected to a second scan signal GI terminal, the first source/drain electrode thereof may be electrically connected to the first electrode of the capacitor Cst, the second source/drain electrode of the third transistor T3, and the gate electrode of the first transistor T1, and the second source/drain electrode thereof may be electrically connected to the initialization voltage VINT and the first source/drain electrode of the seventh transistor T7. The fourth transistor T4 may be turned on by the second scan signal GI to transmit the initialization voltage VINT to the gate electrode of the first transistor T1 to perform an operation of initializing the voltage of the gate electrode of the first transistor T1.

The gate electrode of the fifth transistor T5 may be electrically connected to the emission control signal EM terminal, the first source/drain electrode thereof may be electrically connected to the first power voltage line ELVDL, and the second source/drain electrode thereof may be electrically connected to the first source/drain electrode of the first transistor T1 and the second source/drain electrode of the second transistor T2. The fifth transistor T5 may be turned on by the emission control signal EM to connect the first source/drain electrode of the first transistor T1 and the first power voltage line ELVDL.

The sixth transistor T6 may be electrically connected between the second source/drain electrode of the first transistor T1 and the first electrode of the light emitting element OLED. The gate electrode of the sixth transistor T6 may be electrically connected to the emission control signal EM terminal, the first source/drain electrode thereof may be electrically connected to the second source/drain electrode of the first transistor T1 and the first source/drain electrode of the third transistor T3, and the second source/drain electrode thereof may be electrically connected to the first electrode of the light emitting element OLED.

The fifth transistor T5 and the sixth transistor T6 may be simultaneously turned on according to the emission control signal EM, and thus a driving current may flow through the light emitting element OLED.

The gate electrode of the seventh transistor T7 may be electrically connected to a third scan signal GB terminal. The first source/drain electrode of the seventh transistor T7 may be electrically connected to an initialization voltage VINT terminal. The second source/drain electrode of the seventh transistor T7 may be electrically connected to the anode electrode of the light emitting element OLED. The seventh transistor T7 may be turned on according to the third scan signal GB to initialize the anode electrode of the organic light emitting element OLED.

In this embodiment, although the case where the gate electrode of the seventh transistor T7 receives the third scan signal GI is illustrated, the invention is not limited thereto, and the circuit of the pixel PX may be configured such that the gate electrode of the seventh transistor T7 receives the emission control signal EM.

The capacitor Cst may be formed between the gate electrode of the first transistor T1 and the first power voltage line ELVDL, and include a first electrode and a second electrode. The first electrode of the capacitor Cst may be electrically connected to the gate electrode of the first transistor T1, the second source/drain electrode of the third transistor T3 and the first source/drain electrode of the fourth transistor T4, and the second electrode of the capacitor Cst may be electrically connected to the first power voltage line ELVDL. The capacitor Cst may serve to maintain a constant data voltage applied to the gate electrode of the first transistor T1.

The cathode electrode of the light emitting element OLED may be electrically connected to the second power voltage ELVSS terminal. The light emitting element OLED may receive a driving current from the first transistor T1 and emit light to display an image.

Hereinafter, a cross-sectional structure of the above-described pixel PX will be described in detail.

FIG. 5 is a schematic cross-sectional view of a pixel of a display device according to an embodiment.

In the following embodiments, although some components are substantially the same as the components mentioned in FIGS. 1 to 4, new reference numerals are provided to easily describe arrangement and coupling relationships between components.

Referring to FIG. 5, as described above, the pixel PX may include transistors (the same as 'T1 to T7' in FIG. 4), a capacitor (the same as 'Cst' in FIG. 4), and a light emitting element (the same as 'OLED' in FIG. 4).

Each of the transistors T1 to T7 may include a conductive layer forming an electrode, a semiconductor pattern forming a channel, and an insulating layer. The capacitor Cst may include conductive layers forming an electrode and an insulating layer disposed between the conductive layers. The light emitting element OLED includes conductive layers forming an anode electrode ANO and a cathode electrode CAT, and an organic light emitting layer EL disposed between the conductive layers. The electrical connection of the components may be performed by a line made of a conductive layer and/or a via made of a conductive material. The above-described conductive material, conductive layer, semiconductor layer, insulating layer, and organic light emitting layer EL may be disposed on the substrate SUB.

The transistors T1 to T7 may be disposed on three different layers. In this specification, the layer on which the transistor may be disposed may refer to a layer on which semiconductor patterns ACT1 to ACT7 of the transistors T1 to T7 may be disposed, based on the semiconductor patterns ACT1 to ACT7 of the transistors T1 to T7. The layer on which the transistor may be disposed may include at least one insulating layer and/or at least one conductive layer. For example, each of the transistors T1 to T7 may be disposed over at least one insulating layer and/or at least one conductive layer.

In other words, the semiconductor pattern ACT2 of the second transistor T2 and the semiconductor pattern ACT4 of the fourth transistor T4 may be disposed on the same layer (for example, a substrate SUB or a first semiconductor arrangement layer FS1. The semiconductor pattern ACT1 of the first transistor T1 and the semiconductor pattern ACT3 of the third transistor T3 may be disposed on the same layer (for example, a second interlayer insulating film ILD2 and a third conductive layer 130, or a second semiconductor arrangement layer FS2), but may be disposed on a layer different from the layer (first semiconductor arrangement layer FS1) on which the semiconductor pattern ACT2 of the second transistor T2 and the semiconductor pattern ACT4 of the fourth transistor T4 may be disposed. The semiconductor pattern ACT5 of the fifth transistor T5, the semiconductor pattern ACT6 of the sixth transistor T6, and the semiconductor pattern ACT7 of the seventh transistor T7 may be disposed on the same layer (for example, a fourth interlayer insulating film ILD4 and a sixth conductive layer 160, or a third semiconductor arrangement layer FS3), but may be disposed on a layer different from the layer (first semiconductor arrangement layer FS1) on which the semiconductor pattern ACT2 of the second transistor T2 and the semiconductor pattern ACT4 of the fourth transistor T4 may be disposed, and different from the layer (second semiconductor arrangement layer FS2) on which the semiconductor pattern ACT1 of the first transistor T1 and the semiconductor pattern ACT3 of the third transistor T3 may be disposed.

Specifically, a lower transistor insulating film TIB may be disposed between the semiconductor pattern ACT2 of the second transistor T2 and the semiconductor pattern ACT4 of the fourth transistor T4 and between the semiconductor pattern ACT1 of the first transistor T1 and the semiconductor pattern ACT3 of the third transistor T3. The lower transistor insulating film TIB is not limited thereto, but may include, for example, a first gate insulating film GI2, a first interlayer insulating film ILD1, and a second interlayer insulating film ILD2. The lower transistor insulating film TIB may insulate the semiconductor pattern ACT2 of the second transistor T2, the semiconductor pattern ACT4 of the fourth transistor T4, the semiconductor pattern ACT1 of the first transistor T1 and the semiconductor pattern ACT3 of the third transistor T3 between the semiconductor pattern ACT2 of the second transistor T2 and the semiconductor pattern ACT4 of the fourth transistor T4 and between the semiconductor pattern ACT1 of the first transistor T1 and the semiconductor pattern ACT3 of the third transistor T3.

An upper transistor insulating film TIU may be disposed among the semiconductor pattern ACT1 of the first transistor T1, the semiconductor pattern ACT3 of the third transistor T3, the semiconductor pattern ACT5 of the fifth transistor T5, the semiconductor pattern ACT6 of the sixth transistor T6, and the semiconductor pattern ACT7 of the seventh transistor T7. The upper transistor insulating film TIU is not limited thereto, but may include, for example, a second gate insulating film GI2, a third interlayer insulating film ILD3, and a fourth interlayer insulating film ILD4. The upper transistor insulating film TIU may insulate the semiconductor pattern ACT1 of the first transistor T1, the semiconductor pattern ACT3 of the third transistor T3, the semiconductor pattern ACT5 of the fifth transistor T5, the semiconductor pattern ACT6 of the sixth transistor T6, and the semiconductor pattern ACT7 of the seventh transistor T7 among the semiconductor pattern ACT1 of the first transistor T1, the semiconductor pattern ACT3 of the third transistor T3, the semiconductor pattern ACT5 of the fifth transistor T5, the semiconductor pattern ACT6 of the sixth transistor T6, and the semiconductor pattern ACT7 of the seventh transistor T7.

Even when the transistors T1 to T7 may be insulated by the lower transistor insulating film TIB and the upper transistor insulating film TIU, the transistors T1 to T7 may be electrically connected to each other by contact patterns 131, 132, 133, 161, 162, and 163. Details thereof will be described later.

The display panel 10 may further include a first semiconductor arrangement layer FS1, a second semiconductor arrangement layer FS2 and a third semiconductor arrangement layer FS3. The second transistor T2 and the fourth transistor T4 may be disposed on the first semiconductor arrangement layer FS1, the first transistor T1 and the third transistor T3 may be disposed on the second semiconductor arrangement layer FS2, and the fifth transistor T5, the sixth transistor T6, and the seventh transistor T7 may be disposed on the third semiconductor arrangement layer FS3.

The first semiconductor arrangement layer FS1 may include an upper surface of the substrate SUB. The first semiconductor arrangement layer FS1 may be flat over the entire surface of the substrate SUB. The second semiconductor arrangement layer FS2 may include an upper surface of the second interlayer insulating film ILD2 and an upper surface of the third conductive layer 130. The second semiconductor arrangement layer FS2 may be flat over the entire surface of the substrate SUB. The third semiconductor arrangement layer FS3 may include an upper surface of the fourth interlayer insulating film ILD4 and an upper surface of the sixth conductive layer 160. The third semiconductor arrangement layer FS3 may be flat over the entire surface of the substrate SUB. However, the invention is not limited thereto, and each of the first semiconductor arrangement layer FS1, the second semiconductor arrangement layer FS2, and the third semiconductor arrangement layer FS3 may not be flat (e.g., entirely flat).

A first semiconductor layer SC1, a second semiconductor layer SC2, and a third semiconductor layer SC3 may be disposed on flat surfaces (surfaces of the first semiconductor arrangement layer FS1, the second semiconductor arrangement layer FS2, and the third semiconductor arrangement layer FS3), and thus the process of crystallizing the first semiconductor layer SC1, the second semiconductor layer SC2, and the third semiconductor layer SC3 may be easily performed.

The first transistor T1 and the third transistor T3 may be disposed over the second transistor T2 and the fourth transistor T4, and the fifth transistor T5, the sixth transistor T6, and the seventh transistor T7 may be disposed over the first to fourth transistors T1 to T4. In other words, the second transistor T2 and the fourth transistor T4 may be located at the lowermost of the first to seventh transistors T1 to T7, and the fifth transistor T5, the sixth transistor T6, and the seventh transistor T7 may be located at the uppermost of the first to seventh transistors T1 to T7. The first transistor T1 and the third transistor T3 may be located among the second transistor T2, the fourth transistor T4, the fifth transistor T5, the sixth transistor T6, and the seventh transistor T7.

The second transistor T2 and the fourth transistor T4, among the first to seventh transistors T1 to T7, may be located farthest from the anode electrode ANO of the light emitting element OLED in the thickness direction (third direction DR3), and the fifth transistor T5, the sixth transistor T6, and the seventh transistor T7, among the first to seventh transistors T1 to T7, may be located closest to the anode electrode ANO of the light emitting element OLED in the thickness direction (third direction DR3).

As described above, as the transistors T1 to T7 may be disposed on three different layers (first semiconductor arrangement layer FS1, second semiconductor arrangement layer FS2, and third semiconductor arrangement layer FS3), the area of the plane on which the transistors T1 to T7 of one pixel may be disposed may decrease, and thus the resolution of the display device may be implemented with a higher resolution.

Hereinafter, a laminated structure of each configuration of the display panel 10 will be described in detail.

The display panel 10 according to an embodiment may include semiconductor layers, conductive layers, and insulating layers, which may be disposed on the substrate SUB. The semiconductor layers may include first to third semiconductor layers SC1, SC2, and SC3. The conductive layers may include first to eighth conductive layers 110, 120, 130, 140, 150, 160, 170, and 180. The insulating layers may include first to third gate insulating films GI1, GI2, and GI3 and first to fifth interlayer insulating films ILD1, ILD2, ILD3, ILD4, and ILD5.

The layers of one pixel PX may be arranged in order of a substrate SUB, a first semiconductor layer SC1, a first gate insulating film GI1, a first conductive layer 110, a first interlayer insulating film ILD1, a second conductive layer 120, a second interlayer insulating film ILD2, a third conductive layer 130, a second semiconductor layer SC2, a second gate insulating film GI2, a fourth conductive layer 140, a third interlayer insulating film ILD3, a fifth conductive layer 150, a fourth interlayer insulating film ILD4, a sixth conductive layer 160, a third semiconductor layer SC3, a third gate insulating film GI3, a seventh conductive layer 170, a fifth interlayer insulating film ILD5, and an eighth conductive layer 180, a via layer VIA, an anode electrode ANO, a pixel defining layer PDL, an organic light emitting layer EL, and a cathode electrode CAT. Each of the above-described layers may be formed as a single film, but may also be formed as a laminated film including multiple films. Another layer may be further disposed between the respective layers.

The substrate SUB may support each layer disposed thereon. In case that the display device 1 may be a back emission type or double emission type display device, a transparent substrate may be used. In case that the display device 1 may be a front emission type display device, not only a transparent substrate, but also a translucent or opaque substrate may be used.

The substrate SUB may be made of an insulating material such as glass, quartz, a polymer resin, or a combination thereof. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or combinations thereof. The substrate SUB may include a metal material.

The substrate SUB may be a rigid substrate or a flexible substrate capable of bending, folding, rolling, or the like. Examples of the material constituting the flexible substrate include, but are not limited to, polyimide (PI).

Although not shown in the drawing, a buffer layer may be further disposed on the substrate SUB. The buffer layer (not shown) may be disposed on the entire surface of the substrate SUB. The buffer layer (not shown) may prevent the diffusion of impurity ions, may prevent the penetration of moisture or external air, and may perform a surface planarization function. The buffer layer may include silicon nitride, silicon oxide, or silicon oxynitride.

The first semiconductor layer SC1 may be disposed over the substrate SUB. The first semiconductor layer SC1 may include a semiconductor pattern ACT2 of the second transistor T2 and a semiconductor pattern ACT4 of the fourth transistor T4. The semiconductor pattern ACT2 of the second transistor T2 may include a channel region CH2 overlapping the gate electrode 111 of the overlying second transistor T2 in the thickness direction, a first source/drain region SD21 of the second transistor T2 located at a side of the channel region CH2, and a second source/drain region SD22 of the second transistor T2 located at another side of the channel region CH2. The semiconductor pattern ACT4 of the fourth transistor T4 may include a channel region CH4 overlapping the gate electrode 112 of the overlying fourth transistor T4 in the thickness direction, a first source/drain region SD41 of the fourth transistor T4 located at a side of the channel region CH4, and a second source/drain region SD42 of the fourth transistor T4 located at another side of the channel region CH4.

In other words, the semiconductor pattern ACT2 of the second transistor T2 and the semiconductor pattern ACT4 of the fourth transistor T4 may be active layers constituting the first source/drain regions SD21 and SD41, the second source/drain regions SD22 and SD42, and channel regions CH2 and CH4, which may respectively contact the first source/drain electrode and the second source/drain electrode. One of the first source/drain regions SD21 and SD41 and the second source/drain regions SD22 and SD42 may be a source region and another thereof may be a drain region. Carrier ions may be included in the first and second source/drain regions SD21, SD22, SD41, and SD42 of the semiconductor pattern ACT2 of the second transistor T2 and the semiconductor pattern ACT4 of the fourth transistor T4, so that the first and second source/drain regions SD21, SD22, SD41, and SD42 may have higher conductivity and lower electrical resistance than the channel regions CH2 and CH4.

The first semiconductor layer SC1 may be made of polycrystalline silicon, monocrystalline silicon, amorphous silicon, or a combination thereof. In case that the first semiconductor layer SC1 may be made of polycrystalline silicon, the polycrystalline silicon may be formed by crystallizing amorphous silicon using a crystallization method such as rapid thermal annealing (RTA), solid phase crystallization (SPC), excimer laser annealing (ELA), metal induced crystallization (MIC), metal induced lateral crystallization (MILC), or sequential lateral solidification (SLS).

However, the invention is not limited thereto, and the first semiconductor layer SC1 may include an oxide semiconductor. The oxide may include an oxide of at least one selected from G-I-Z-O, zinc (Zn), indium (In), gallium (Ga), tin (Sn), cadmium (Cd), germanium (Ge), hafnium (Hf), or combinations thereof. The oxide may include at least one of indium-gallium-zinc oxide (IGZO), zinc-tin oxide (ZTO), and indium tin oxide (IZO).

The first gate insulating film GI1 may be disposed on the first semiconductor layer SC1. The first gate insulating film GI1 may cover not only the upper surface of the first semiconductor layer SC1 except the portions where the contact holes CNT1, CNT2, CNT3, and CNT4 may be formed, but also cover the side surfaces of the first semiconductor layer SC1. The first gate insulating film GI1 may be generally disposed over the entire surface of the substrate SUB.

The first gate insulating film GI1 may include a silicon compound, a metal oxide, or the like, or a combination thereof. For example, the first gate insulating film GI1 may include silicon oxide, silicon nitride, silicon oxynitride, aluminum oxide, tantalum oxide, hafnium oxide, zirconium oxide, titanium oxide, or the like. These may be used alone or in combination with each other.

The first conductive layer 110 may be disposed on the first gate insulating layer GI1. The first conductive layer 110 may include a gate electrode 111 of the second transistor T2 and a gate electrode 112 of the fourth transistor T4. The first conductive layer 110 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first interlayer insulating film ILD1 may be disposed on the first conductive layer 110. The first interlayer insulating film ILD1 may cover not only the upper surface of the first conductive layer 110 except the portions where the contact holes CNT1, CNT2, CNT3, and CNT4 may be formed, but also cover the side surfaces of the first conductive layer 110. The first interlayer insulating film ILD1 may be generally disposed over the entire surface of the substrate SUB.

The first interlayer insulating film ILD1 may include a silicon compound, a metal oxide, or the like, or a combination thereof. For example, the first interlayer insulating film ILD1 may include silicon oxide, silicon nitride, silicon oxynitride, aluminum oxide, tantalum oxide, hafnium oxide, zirconium oxide, titanium oxide, or the like. These may be used alone or in combination with each other.

The second conductive layer 120 may be disposed on the first interlayer insulating film ILD1. The second conductive layer 120 may include a data line (DL, hereinafter '121'), a first conductive pattern 122, a second conductive pattern 123, and an initialization line 124.

The data line 121 may be electrically connected to the first source/drain region SD21 of the second transistor T2 through the first contact hole CNT1 that penetrates the first interlayer insulating film ILD1 and the first gate insulating film GI1 to expose the first source/drain region SD21 of the second transistor T2. The data line 121 itself may be a first source/drain electrode of the second transistor T2, or a part of the data line 121 may be a first source/drain electrode of the second transistor T2.

The first conductive pattern 122 may be electrically connected to the second source/drain region SD22 of the second transistor T2 through the second contact hole CNT2 that penetrates the first interlayer insulating film ILD1 and the first gate insulating film GI1 to expose the second source/drain region SD22 of the second transistor T2. The first conductive pattern 122 may electrically connect the second source/drain region SD22 of the second transistor T2 and the first source/drain region SD11 of the first transistor T1 together with a first contact pattern 131 to be described later. The first conductive pattern 122 itself may be a second source/drain electrode of the second transistor T2, or a part of the first conductive pattern 122 may be a second source/drain electrode of the second transistor T2.

The second conductive pattern 123 may be electrically connected to the first source/drain region SD41 of the fourth transistor T4 through the third contact hole CNT3 that penetrates the first interlayer insulating film ILD1 and the first gate insulating film GI1 to expose the first source/drain region SD41 of the fourth transistor T4. The second conductive pattern 123 may electrically connect the first source/drain region SD41 of the fourth transistor T4 and the second source/drain region SD32 of the third transistor T3 together with a second contact pattern 132 to be described later. The second conductive pattern 123 itself may be a first source/drain electrode of the fourth transistor T4, or a part of the second conductive pattern 123 may be a first source/drain electrode of the fourth transistor T4.

The initialization line 124 may be electrically connected to the second source/drain region SD42 of the fourth transistor T4 through the fourth contact hole CNT4 that penetrates the first interlayer insulating film ILD1 and the first gate insulating film GI1 to expose the second source/drain region SD42 of the fourth transistor T4. The initialization line 124 itself may be a second source/drain electrode of the fourth transistor T4, or a part of the initialization line 124 may be a second source/drain electrode of the fourth transistor T4.

The second conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second interlayer insulating film ILD2 may be disposed on the second conductive layer 120. The second interlayer insulating film ILD2 may cover not only the upper surface of the second conductive layer 120 except the portions where the contact holes CNT5, CNT6, an CNT7 may be formed, but also cover the side surfaces of the second conductive layer 120. The second interlayer insulating film ILD2 may be generally disposed over the entire surface of the substrate SUB.

The upper surface of the second interlayer insulating layer ILD2 may be flat without a step. Therefore, a process of crystallizing the second semiconductor layer SC2 disposed on the second interlayer insulating film ILD2 may be easily performed. Details thereof will be described later.

The second interlayer insulating film ILD2 may include a silicon compound, a metal oxide, or the like, or a combination thereof. For example, the second interlayer insulating film ILD2 may include silicon oxide, silicon nitride, silicon oxynitride, aluminum oxide, tantalum oxide, hafnium oxide, zirconium oxide, titanium oxide, or the like. These may be used alone or in combination with each other.

The third conductive layer 130 may be disposed on the second interlayer insulating film ILD2. The third conductive layer 130 may include a first contact pattern 131, a second contact pattern 132, and a third contact pattern 133.

The first contact pattern 131 may be disposed in the fifth contact hole CNT5 that penetrates the second interlayer insulating film ILD2 to expose the first conductive pattern 122. The first contact pattern 131 may electrically connect the underlying first conductive pattern 122 and the overlying first source/drain region SD11 of the first transistor T1. Accordingly, the first source/drain region SD11 of the first transistor T1 and the second source/drain region SD22 of the second transistor T2 may be electrically connected by the first contact pattern 131 and the first conductive pattern 122. The first contact pattern 131 may be a second source/drain electrode of the second transistor T2, and may be a first source/drain electrode of the first transistor T1.

The second contact pattern 132 may be disposed in the sixth contact hole CNT6 that penetrates the second interlayer insulating film ILD2 to expose the second conductive pattern 123. The second contact pattern 132 may electrically connect the underlying second conductive pattern 123 and the overlying second source/drain region SD32 of the third transistor T3. Accordingly, the second source/drain region SD32 of the third transistor T3 and the first source/drain region SD41 of the fourth transistor T4 may be electrically connected by the second contact pattern 132 and the second conductive pattern 123. The second contact pattern 132 may be a first source/drain electrode of the fourth transistor T4, and may be a second source/drain electrode of the third transistor T3.

The third contact pattern 133 may be disposed in the seventh contact hole CNT7 that penetrates the second interlayer insulating film ILD2 to expose the initialization line 124. The third contact pattern 133 may electrically connect the underlying initialization line 124 and the overlying sixth contact pattern 163. The third contact pattern 133 may be a second source/drain electrode of the fourth transistor T4, and may be a first source/drain electrode of the seventh transistor T7.

The first contact pattern 131, the second contact pattern 132, and the third contact pattern 133 may be surrounded by the second interlayer insulating film ILD2. The upper surface of the first contact pattern 131, the upper surface of the second contact pattern 132, and the upper surface of the third contact pattern 133 may be in contact with each other without a step with the upper surface of the second interlayer insulating film ILD2. In an embodiment, the upper surface of the first contact pattern 131, the upper surface of the second contact pattern 132, and the upper surface of the third contact pattern 133 may be located at the same level as the upper surface of the second interlayer insulating film ILD2, and may be located substantially on the same plane. For example, as described above, the second semiconductor arrangement layer FS2 may include an upper surface of the second interlayer insulating film ILD2 and an upper surface of the third conductive layer 130, and may be substantially (or entirely) flat. Therefore, although the second semiconductor layer SC2 may be disposed over the second interlayer insulating film ILD2 and the third conductive layer 130, the process of crystallizing the second semiconductor layer SC2 may be easily performed.

The third conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second semiconductor layer SC2 may be disposed on the second interlayer insulating film ILD2 and the third conductive layer 130. The second semiconductor layer SC2 may be disposed over the third conductive layer 130 and the second interlayer insulating film ILD2. For example, the second semiconductor layer SC2 may be disposed on the second interlayer insulating film ILD2 while covering at least a part of the third conductive layer 130.

The second semiconductor layer SC2 may include a semiconductor pattern ACT1 of the first transistor T1 and a semiconductor pattern ACT3 of the third transistor T3, and a first semiconductor connection portion LK1. The semiconductor pattern ACT1 of the first transistor T1 may include a channel region CH1 overlapping the gate electrode 141 of the overlying first transistor T1 in the thickness direction, a first source/drain region SD11 of the first transistor T1 located at a side of the channel region CH1, and a second source/drain region SD12 of the first transistor T1 located at another side of the channel region CH1. The semiconductor pattern ACT3 of the third transistor T3 may include a channel region CH3 overlapping the gate electrode 142 of the overlying third transistor T3 in the thickness direction, a first source/drain region SD31 of the third transistor T3 located at a side of the channel region CH3, and a second source/drain region SD32 of the third transistor T3 located at another side of the channel region CH3.

In other words, the semiconductor pattern ACT1 of the first transistor T1 and the semiconductor pattern ACT3 of the third transistor T3 may be active layers constituting the first source/drain regions SD11 and SD31, the second source/drain regions SD12 and SD32, and channel regions CH1 and CH3, which respectively contact the first source/drain electrode and the second source/drain electrode. One of the first source/drain regions SD11 and SD31 and the second source/drain regions SD12 and SD32 may be a source region and another thereof may be a drain region. Carrier ions may be included in the first and second source/drain regions SD11, SD12, SD31, and SD32 of the semiconductor pattern ACT2 of the semiconductor pattern ACT1 of the first transistor T1 and the semiconductor pattern ACT3 of the third transistor T3, so that the first and second source/drain regions SD11, SD12, SD31, and SD32 may have higher conductivity and lower electrical resistance than the channel regions CH1 and CH3.

The first semiconductor connection portion LK1 may be disposed between the semiconductor pattern ACT1 of the first transistor T1 and the semiconductor pattern ACT3 of the third transistor T3. The first semiconductor connection portion LK1 may electrically connect the second source/drain region SD12 of the first transistor T1 and the first source/drain region SD31 of the third transistor T3. Like the first and second source/drain regions SD11, SD12, SD31, SD32 of the semiconductor pattern ACT1 of the first transistor T1 and the semiconductor pattern ACT3 of the third transistor T3, the first semiconductor connection portion LK1 may include carrier ions, so that the first semiconductor connection portion LK1 may have high conductivity and low electrical resistance.

The second semiconductor layer SC2 may be made of polycrystalline silicon, monocrystalline silicon, amorphous silicon, or a combination thereof. In case that the second semiconductor layer SC2 may be made of polycrystalline silicon, the polycrystalline silicon may be formed by crystallizing amorphous silicon using a crystallization method such as rapid thermal annealing (RTA), solid phase crystallization (SPC), excimer laser annealing (ELA), metal induced crystallization (MIC), metal induced lateral crystallization (MILC), or sequential lateral solidification (SLS).

The semiconductor pattern ACT1 of the first transistor T1, which may be a driving transistor, may be spaced apart from the substrate SUB by a distance, thereby reducing the influence of the substrate SUB on the first transistor T1. Accordingly, the display device 1 may be improved.

However, the invention is not limited thereto, and the second semiconductor layer SC2 may include an oxide semiconductor. The oxide may include an oxide of at least one selected from G-I-Z-O, zinc (Zn), indium (In), gallium (Ga), tin (Sn), cadmium (Cd), germanium (Ge), hafnium (Hf), or combinations thereof. The oxide may include at least one of indium-gallium-zinc oxide (IGZO), zinc-tin oxide (ZTO), and indium tin oxide (IZO).

The second gate insulating film GI2 may be disposed on the second semiconductor layer SC2. The second gate insulating film GI2 may cover not only the upper surface of the second semiconductor layer SC2 except the portions where the contact holes CNT8, CNT9, and CNT10 may be formed, but also cover the side surfaces of the second semiconductor layer SC2. Further, the second gate insulating layer GI2 may cover at least a part of the upper surface of the first contact pattern 131, the upper surface of the second contact pattern 132, and the upper surface of the third contact pattern 133. The second gate insulating film GI2 may be generally disposed over the entire surface of the substrate SUB.

The second gate insulating film GI2 may include a silicon compound, a metal oxide, or the like, or a combination thereof. For example, the second gate insulating film GI2 may include silicon oxide, silicon nitride, silicon oxynitride, aluminum oxide, tantalum oxide, hafnium oxide, zirconium oxide, titanium oxide, or the like. These may be used alone or in combination with each other.

The fourth conductive layer 140 may be disposed on the second gate insulating film GI2. The fourth conductive layer 140 may include a gate electrode 141 of the first transistor T1 and a gate electrode 142 of the third transistor T3.

The gate electrode 141 of the first transistor T1 may be electrically connected to a first electrode of the capacitor Cst. The first electrode of the capacitor Cst may be formed of the gate electrode 141 itself of the first transistor T1, or may be formed of a portion extending from the gate electrode 141 of the first transistor T1. For example, a part of the pattern of the integrated fourth conductive layer 140 may overlap the semiconductor pattern ACT1 of the first transistor T1 to function as the gate electrode 141 of the first transistor T1 at the corresponding site, and another part thereof may not overlap the semiconductor pattern ACT1 of the first transistor T1 to function as the first electrode of the capacitor Cst overlapping the second electrode 151 of the capacitor Cst.

The fourth conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third interlayer insulating film ILD3 may be disposed on the fourth conductive layer 140. The third interlayer insulating film ILD3 may cover not only the upper surface of the fourth conductive layer 140 except the portions where the contact holes CNT8, CNT9, and CNT10 may be formed, but also cover the side surfaces of the fourth conductive layer 140. The third interlayer insulating film ILD3 may be generally disposed over the entire surface of the substrate SUB.

The third interlayer insulating film ILD3 may include a silicon compound, a metal oxide, or the like, or a combination thereof. For example, the first interlayer insulating film ILD1 may include silicon oxide, silicon nitride, silicon oxynitride, aluminum oxide, tantalum oxide, hafnium oxide, zirconium oxide, titanium oxide, or the like. These may be used alone or in combination with each other.

The fifth conductive layer 150 may be disposed on the third interlayer insulating film ILD3. The fifth conductive layer 150 may include a second electrode 151 of the capacitor Cst. The second electrode 151 of the capacitor Cst may face the first electrode of the capacitor Cst electrically connected to the gate electrode 141 of the underlying first transistor T1 with the third interlayer insulating film ILD3 therebetween to form the capacitor Cst.

The capacitor Cst may be disposed on the second transistor T2 and the fourth transistor T4, and may be disposed under the fifth to seventh transistors T5 to T7. For example, the capacitor Cst may be located between the second transistor T2 and the fourth transistor T4 and the fifth to seventh transistors T5 to T7.

The fifth conductive layer 150 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth interlayer insulating film ILD4 may be disposed on the fifth conductive layer 150. The fourth interlayer insulating film ILD4 may cover not only the upper surface of the fifth conductive layer 150 except the portions where the contact holes CNT8, CNT9, and CNT10 may be formed, but also cover the side surfaces of the fifth conductive layer 150. The fourth interlayer insulating film ILD4 may be generally disposed over the entire surface of the substrate SUB.

The upper surface of the fourth interlayer insulating film ILD4 may be flat without a step. Therefore, the process of crystallizing the third semiconductor layer SC3 disposed on the fourth interlayer insulating film ILD4 may be easily performed. Details thereof will be described later.

The fourth interlayer insulating film ILD4 may include a silicon compound, a metal oxide, or the like. For example, the first interlayer insulating film ILD1 may include silicon oxide, silicon nitride, silicon oxynitride, aluminum oxide, tantalum oxide, hafnium oxide, zirconium oxide, titanium oxide, or the like. These may be used alone or in combination with each other.

The sixth conductive layer 160 may be disposed on the fourth interlayer insulating film ILD4. The sixth conductive layer 160 may include a fourth contact pattern 161, a fifth contact pattern 162, and a sixth contact pattern 163.

The fourth contact pattern 161 may be disposed in the eighth contact hole CNT8 that penetrates the fourth interlayer insulating film ILD4 to expose the first source/drain region SD11 of the first transistor T1. The fourth contact pattern 161 may electrically connect the underlying first source/drain region SD11 of the first transistor T1 and the overlying second semiconductor connection portion LK2. However, the second semiconductor connection portion LK2 may be omitted, and in this case, the fourth contact pattern 161 may be in direct contact with the second source/drain region SD52 of the fifth transistor T5, and may electrically connect the underlying first source/drain region SD11 of the first transistor T1 and the underlying second source/drain region SD52 of the fifth transistor T5. Accordingly, the first source/drain region SD11 of the first transistor T1 and the second source/drain region SD52 of the fifth transistor T5 may be electrically connected by the fourth contact pattern 161. The fourth contact pattern 161 may be a first source/drain electrode of the first transistor T1, and may be a second source/drain electrode of the fifth transistor T5.

The fifth contact pattern 162 may be disposed in the ninth contact hole CNT9 that penetrates the fourth interlayer insulating film ILD4 to expose the second source/drain region SD12 of the first transistor T1. The fifth contact pattern 162 may electrically connect the underlying second source/drain region SD12 of the first transistor T1 and the overlying third semiconductor connection portion LK3. However, the third semiconductor connection portion LK3 may be omitted, and in this case, the fifth contact pattern 162 may be in direct contact with the first source/drain region SD61 of the sixth transistor T6, and may electrically connect the underlying second source/drain region SD12 of the first transistor T1 and the underlying first source/drain region SD61 of the sixth transistor T6. Accordingly, the second source/drain region SD12 of the first transistor T1 and the first source/drain region SD61 of the sixth transistor T6 may be electrically connected by the fifth contact pattern 162. The fifth contact pattern 162 may be a second source/drain electrode of the first transistor T1, and may be a first source/drain electrode of the sixth transistor T6.

The sixth contact pattern 163 may be disposed in the tenth contact hole CNT10 that penetrates the fourth interlayer insulating film ILD4 to expose the third contact pattern 133. The sixth contact pattern 163 may electrically connect the underlying third contact pattern 133 and the overlying first source/drain electrode SD71 of the seventh transistor T7. Accordingly, the first source/drain electrode SD71 of the seventh transistor T7 and the second source/drain electrode SD42 of the fourth transistor T4 may be electrically connected by the sixth contact pattern 163, the third contact pattern 133, and the initialization line 124. The sixth contact pattern 163 may be a second source/drain electrode of the fourth transistor T4, and may be a first source/drain electrode of the seventh transistor T7.

The fourth contact pattern 161, the fifth contact pattern 162, and the sixth contact pattern 163 may be surrounded by the fourth interlayer insulating film ILD4. The upper surface of the fourth contact pattern 161, the upper surface of the fifth contact pattern 162, and the upper surface of the fifth contact pattern 163 may be in contact with each other without a step with the upper surface of the fourth interlayer insulating film ILD4. In an embodiment, the upper surface of the fourth contact pattern 161, the upper surface of the fifth contact pattern 162, and the upper surface of the fifth contact pattern 163 may be located at the same level as the upper surface of the fourth interlayer insulating film ILD4, and may be located substantially on the same plane. For example, as described above, the third semiconductor arrangement layer FS3 may include an upper surface of the fourth interlayer insulating film ILD4 and an upper surface of the sixth conductive layer 160, and may be substantially (or entirely) flat. Therefore, although the third semiconductor layer SC3 may be disposed over the fourth interlayer insulating film ILD4 and the sixth conductive layer 160, the process of crystallizing the third semiconductor layer SC3 may be easily performed.

The sixth conductive layer 160 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third semiconductor layer SC3 may be disposed on the fourth interlayer insulating film ILD4 and the sixth conductive layer 160. The third semiconductor layer SC3 may be disposed over the sixth conductive layer 160 and the fourth interlayer insulating film ILD4. For example, the third semiconductor layer SC3 may be disposed on the fourth interlayer insulating film ILD4 while covering at least a part of the sixth conductive layer 160.

The sixth conductive layer 160 may include a semiconductor pattern ACT5 of the fifth transistor T5, a semiconductor pattern ACT6 of the sixth transistor T6, a semiconductor pattern ACT7 of the seventh transistor T7, a second semiconductor connection portion LK2, and a third semiconductor connection portion LK3.

The semiconductor pattern ACT5 of the fifth transistor T5 may include a channel region CH5 overlapping the gate electrode 171 of the overlying fifth transistor T5 in the thickness direction, a first source/drain region SD51 of the fifth transistor T5 located at a side of the channel region CH5, and a second source/drain region SD52 of the fifth transistor T5 located at another side of the channel region CH5. The semiconductor pattern ACT6 of the sixth transistor T6 may include a channel region CH6 overlapping the gate electrode 172 of the overlying sixth transistor T6 in the thickness direction, a first source/drain region SD61 of the sixth transistor T6 located at a side of the channel region CH6, and a second source/drain region SD62 of the sixth transistor T6 located at another side of the channel region CH6. The semiconductor pattern ACT7 of the seventh transistor T7 may include a channel region CH7 overlapping the gate electrode 173 of the overlying seventh transistor T7 in the thickness direction, a first source/drain region SD71 of the seventh transistor T7 located at a side of the channel region CH7, and a second source/drain region SD72 of the seventh transistor T7 located at another side of the channel region CH7.

In other words, the semiconductor pattern ACT5 of the fifth transistor T5, the semiconductor pattern ACT6 of the sixth transistor T6, and the semiconductor pattern ACT7 of the seventh transistor T7 may be active layers constituting the first source/drain regions SD51, SD61, and SD71, the second source/drain regions SD52, SD62, and SD72, and channel regions CH5, CH6, and CH7, which respectively contact the first source/drain electrode and the second source/drain electrode. One of the first source/drain regions SD51, SD61, and SD71 and the second source/drain regions SD52, SD62, and SD72 may be a source region and another thereof may be a drain region. Carrier ions may be included in the first and second source/drain regions SD51, SD52, SD61, SD62, SD71, and SD72 of the semiconductor pattern ACT5 of the fifth transistor T5, the semiconductor pattern ACT6 of the sixth transistor T6, and the semiconductor pattern ACT7 of the seventh transistor T7, so that the first and second source/drain regions SD51, SD52, SD61, SD62, SD71 may have higher conductivity and lower electrical resistance than the channel regions CH5, CH6, and CH7.

The second semiconductor connection portion LK2 may be disposed on the side surface of the semiconductor pattern ACT5 of the fifth transistor T5. The second semiconductor connection portion LK2 may electrically connect the second source/drain region SD52 of the fifth transistor T5 and the fourth contact pattern 161.

The third semiconductor connection portion LK3 may be disposed on the side surface of the semiconductor pattern ACT6 of the sixth transistor T6. The third semiconductor connection portion LK3 may electrically connect the first source/drain region SD61 of the sixth transistor T6 and the fifth contact pattern 162.

Like the first and second source/drain regions SD51, SD52, SD61, SD62, SD71, and SD72 of the semiconductor pattern ACT5 of the fifth transistor T5, the semiconductor pattern ACT6 of the sixth transistor T6, and the semiconductor pattern ACT7 of the seventh transistor T7, each of the second semiconductor connection portion LK2 and the third semiconductor connection portion LK3 may include carrier ions, so that each of the second semiconductor connection portion LK2 and the third semiconductor connection portion LK3 may have high conductivity and low electrical resistance.

The third semiconductor layer SC3 may be made of polycrystalline silicon, monocrystalline silicon, or amorphous silicon. In case that the third semiconductor layer SC3 may be made of polycrystalline silicon, the polycrystalline silicon may be formed by crystallizing amorphous silicon using a crystallization method such as rapid thermal annealing (RTA), solid phase crystallization (SPC), excimer laser annealing (ELA), metal induced crystallization (MIC), metal induced lateral crystallization (MILC), or sequential lateral solidification (SLS).

However, the invention is not limited thereto, and the third semiconductor layer SC3 may include an oxide semiconductor. The oxide may include an oxide of at least one selected from G-I-Z-O, zinc (Zn), indium (In), gallium (Ga), tin (Sn), cadmium (Cd), germanium (Ge), hafnium (Hf), or combinations thereof. The oxide may include at least one of indium-gallium-zinc oxide (IGZO), zinc-tin oxide (ZTO), and indium tin oxide (IZO).

The third gate insulating film GI3 may be disposed on the third semiconductor layer SC3. The third gate insulating film GI3 may cover not only the upper surface of the third semiconductor layer SC3 except the portions where the contact holes CNT11, CNT12, and CNT13 may be formed, but also cover the side surfaces of the third semiconductor layer SC3. Further, the third gate insulating film GI3 may cover at least a part of the upper surface of the fourth contact pattern 161, the upper surface of the fifth contact pattern 162, and the upper surface of the sixth contact pattern 163. The third gate insulating film GI3 may be generally disposed over the entire surface of the substrate SUB.

The third gate insulating film GI3 may include a silicon compound, a metal oxide, or the like, or a combination thereof. For example, the third gate insulating film GI3 may include silicon oxide, silicon nitride, silicon oxynitride, aluminum oxide, tantalum oxide, hafnium oxide, zirconium oxide, titanium oxide, or the like. These may be used alone or in combination with each other.

The seventh conductive layer 170 may be disposed on the third gate insulating film GI3. The seventh conductive layer 170 may include a gate electrode 171 of the fifth transistor T5, a gate electrode 172 of the sixth transistor T6, and a gate electrode 173 of the seventh transistor T7. The seventh conductive layer 170 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fifth interlayer insulating film ILD5 may be disposed on the seventh conductive layer 170. The fifth interlayer insulating film ILD5 may cover not only the upper surface of the seventh conductive layer 170 except the portions where the contact holes CNT11, CNT12, and CNT13 may be formed, but also cover the side surfaces of the seventh conductive layer 170. The fifth interlayer insulating film ILD5 may be generally disposed over the entire surface of the substrate SUB. The fifth interlayer insulating film ILD5 may include a silicon compound, a metal oxide, or the like, or a combination thereof. For example, the fifth interlayer insulating film ILD5 may include silicon oxide, silicon nitride, silicon oxynitride, aluminum oxide, tantalum oxide, hafnium oxide, zirconium oxide, titanium oxide, or the like. These may be used alone or in combination with each other.

The eighth conductive layer 180 may be disposed on the fifth interlayer insulating film ILD5. The eighth conductive layer 180 may include a first power voltage line ELVDL (hereinafter, "181"), a third conductive pattern 182, and a fourth conductive pattern 183.

The first power voltage line 181 may be electrically connected to the first source/drain region SD51 of the fifth transistor T5 through the eleventh contact hole CNT11 that penetrates the fifth interlayer insulating film ILD5 and the third gate insulating film GI3 to expose the first source/drain region SD51 of the fifth transistor T5. The first power voltage line 181 itself may be a first source/drain electrode of the fifth transistor T5, or a part of the first power voltage line 181 may be a first source/drain electrode of the fifth transistor T4.

The third conductive pattern 182 may be electrically connected to the second source/drain region SD62 of the sixth transistor T6 through the twelfth contact hole CNT12 that penetrates the fifth interlayer insulating film ILD5 and the third gate insulating film GI3 to expose the second source/drain region SD62 of the sixth transistor T6. The third conductive pattern 182 may electrically connect the second source/drain region SD62 of the sixth transistor T6 and the anode electrode ANO. The third conductive pattern 182 itself may be a second source/drain electrode of the sixth transistor T6, or a part of the third conductive pattern 182 may be a second source/drain electrode of the sixth transistor T6. The third conductive pattern 182 may be a second source/drain electrode of the sixth transistor T6.

The fourth conductive pattern 183 may be electrically connected to the second source/drain region SD72 of the seventh transistor T7 through the thirteenth contact hole CNT13 that penetrates the fifth interlayer insulating film ILD5 and the third gate insulating film GI3 to expose the second source/drain region SD72 of the seventh transistor T7. The fourth conductive pattern 183 may electrically connect the second source/drain region SD72 of the seventh transistor T7 and the anode electrode ANO. The fourth conductive pattern 183 itself may be a second source/drain electrode of the seventh transistor T7, or a part of the fourth conductive pattern 183 may be a second source/drain electrode of the seventh transistor T7. The fourth conductive pattern 183 may be a second source/drain electrode of the seventh transistor T7.

The via layer VIA may be disposed on the eighth conductive layer 180. The via layer VIA may include an inorganic insulating material or an organic insulating material such as polyacrylate resin, epoxy resin, phenolic resin, polyamide resin, polyimide rein, unsaturated polyester resin, polyphenylenether resin, polyphenylene sulfide resin, benzocyclobutene (BCB), or a combination thereof. The anode electrode ANO may be disposed on the via layer VIA. The anode electrode ANO may be a pixel electrode that may be separately disposed for each pixel PX. The anode electrode ANO may be electrically connected to the third conductive pattern 182 through the fourteenth contact hole CNT14 passing through the via layer VIA to expose the third conductive pattern 182, and may be electrically connected to the fourth conductive pattern 183 through the fifteenth contact hole CNT15 passing through the via layer VIA to expose the fourth conductive pattern 183.

An anode electrode ANO may have a laminated film structure in which a high-work-function material layer including Indium-Tin-Oxide (ITO), Indium-Zinc-Oxide (IZO), Zinc Oxide (ZnO), or Indium Oxide ($In_2O_3$) and a reflective material layer including silver (Ag), magnesium (Mg), aluminum (Al), platinum (Pt), lead (Pd), gold (Au), nickel (Ni), neodymium (Nd), iridium (Ir), chromium (Cr), Lithium (Li), calcium (Ca) or a mixture thereof may be laminated. The high-work-function material layer may be disposed over the reflective material layer to be closer to the light emitting layer EL. The anode electrode ANO may have a multi-layer structure of ITO/Mg, ITO/MgF, ITO/Ag, or ITO/Ag/ITO, but the invention is not limited thereto.

A pixel defining layer PDL may be disposed on the anode electrode ANO. The pixel defining layer PDL may include an opening partially exposing the anode electrode ANO. The pixel defining layer PDL may include an organic insulating material or an inorganic insulating material. For example, the pixel defining layer PDL may include at least one of polyimide resin, acrylic resin, a silicon compound, and polyacrylic resin.

The light emitting layer EL may be disposed on the anode electrode ANO exposed by the pixel defining layer PDL. The light emitting layer EL may include an organic material layer. The organic material layer of the light emitting layer EL may include an organic light emitting layer, and may further include a hole injection/transport layer and/or an electron injection/transport layer.

A cathode electrode CAT may be disposed on the light emitting layer EL. The cathode electrode CAT may be a common electrode that may be entirely disposed regardless of the pixels PX. The cathode electrode CAT may include a low-work-function material layer including lithium (Li), calcium Ca, lithium fluoride/calcium (LiF/Ca), lithium fluoride/aluminum (LiF/Al), aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), a compound thereof, or a mixture thereof (for example, a mixture of Ag and Mg). The cathode electrode CAT may further include a transparent metal oxide layer disposed on the low-work-function material layer.

The anode electrode ANO, the light emitting layer EL, and the cathode electrode CAT may constitute an organic light emitting element.

A thin film encapsulation layer 190 may be disposed on the cathode electrode CAT. The thin film encapsulation layer 190 may include a first inorganic layer 191, a first organic layer 192, and a second inorganic layer 193. At the ends of the thin film encapsulation layer 190, the first inorganic layer 191 and the second inorganic layer 193 may contact each other. The first organic layer 192 may be encapsulated by the first inorganic layer 191 and the second inorganic layer 193. Each of the first inorganic layer 191 and the second inorganic layer 193 may each include silicon nitride, silicon oxide, or silicon oxynitride. The first organic layer 192 may include an organic insulating material.

Hereinafter, a method of manufacturing the display device 1 according to an embodiment will be described.

FIGS. 6 to 25 are schematic cross-sectional views illustrating a method of manufacturing a display device according to an embodiment.

Figure 6:
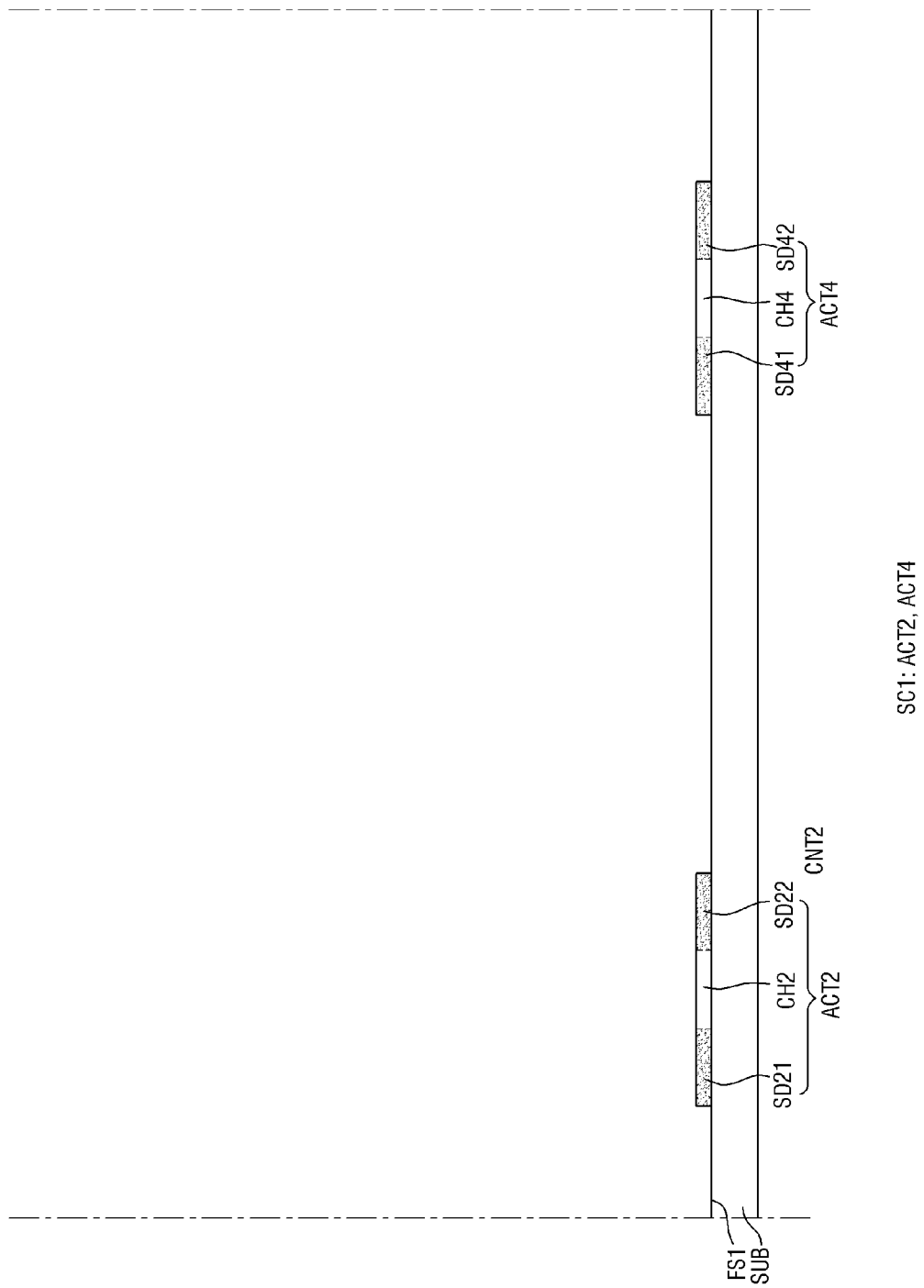
FIGS. 6 to 25 are schematic cross-sectional views illustrating a method of manufacturing a display device according to an embodiment.

Referring to FIG. 6, a substrate SUB provided with a first semiconductor layer SC1 that is patterned may be prepared. Specifically, as shown in FIG. 6, the first semiconductor layer SC1 may be formed by entirely depositing a first semiconductor material on the upper surface of the substrate SUB, that is, on a first semiconductor arrangement layer FS1, and then patterning the first semiconductor material by a photolithography process.

Figure 7:
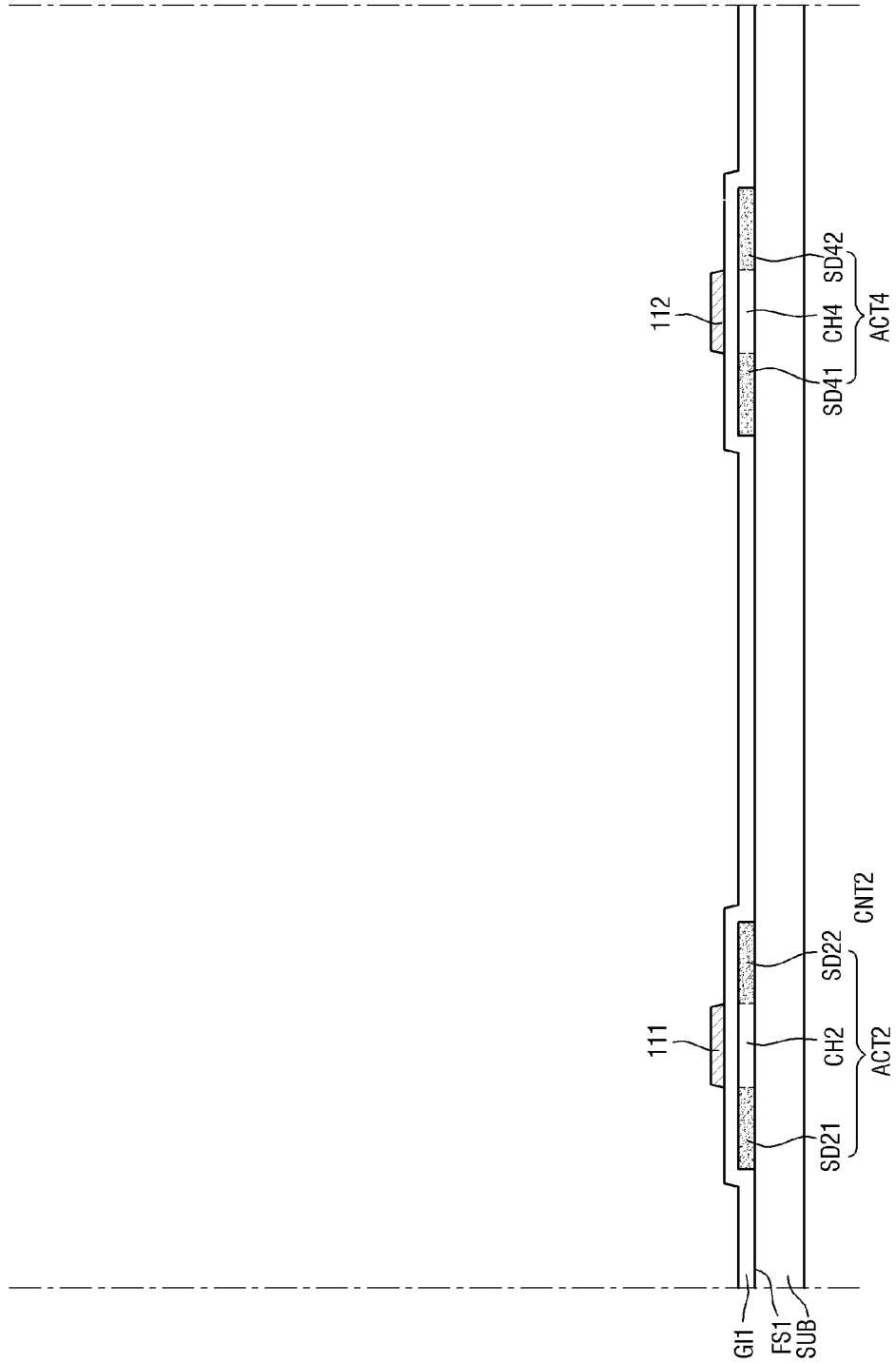

Subsequently, referring to FIG. 7, a first gate insulating film GI1 may be formed on the first semiconductor layer SC1, and a first conductive layer 110 including a gate electrode 111 of a second transistor T2 and a gate electrode 112 of a fourth transistor T4 may be formed on the first gate insulating film GI1.

Specifically, a first gate insulating film GI1 may be formed on the entire surface of the substrate SUB on which the first semiconductor layer SC1 may be formed. Subsequently, a gate electrode 111 of a second transistor T2 and a gate electrode 112 of a fourth transistor T4 may be formed on the first gate insulating film GI1. The gate electrode 111 of the second transistor T2 and the gate electrode 112 of the fourth transistor T4, which may be patterned, may be formed by one mask process. For example, as shown in FIG. 7, the gate electrode 111 of the second transistor T2 and the gate electrode 112 of the fourth transistor T4 may be formed by entirely depositing a material layer for the first conductive layer on the first gate insulating film GI1 and then patterning the material layer for the first conductive layer by a photolithography process.

Figure 8:
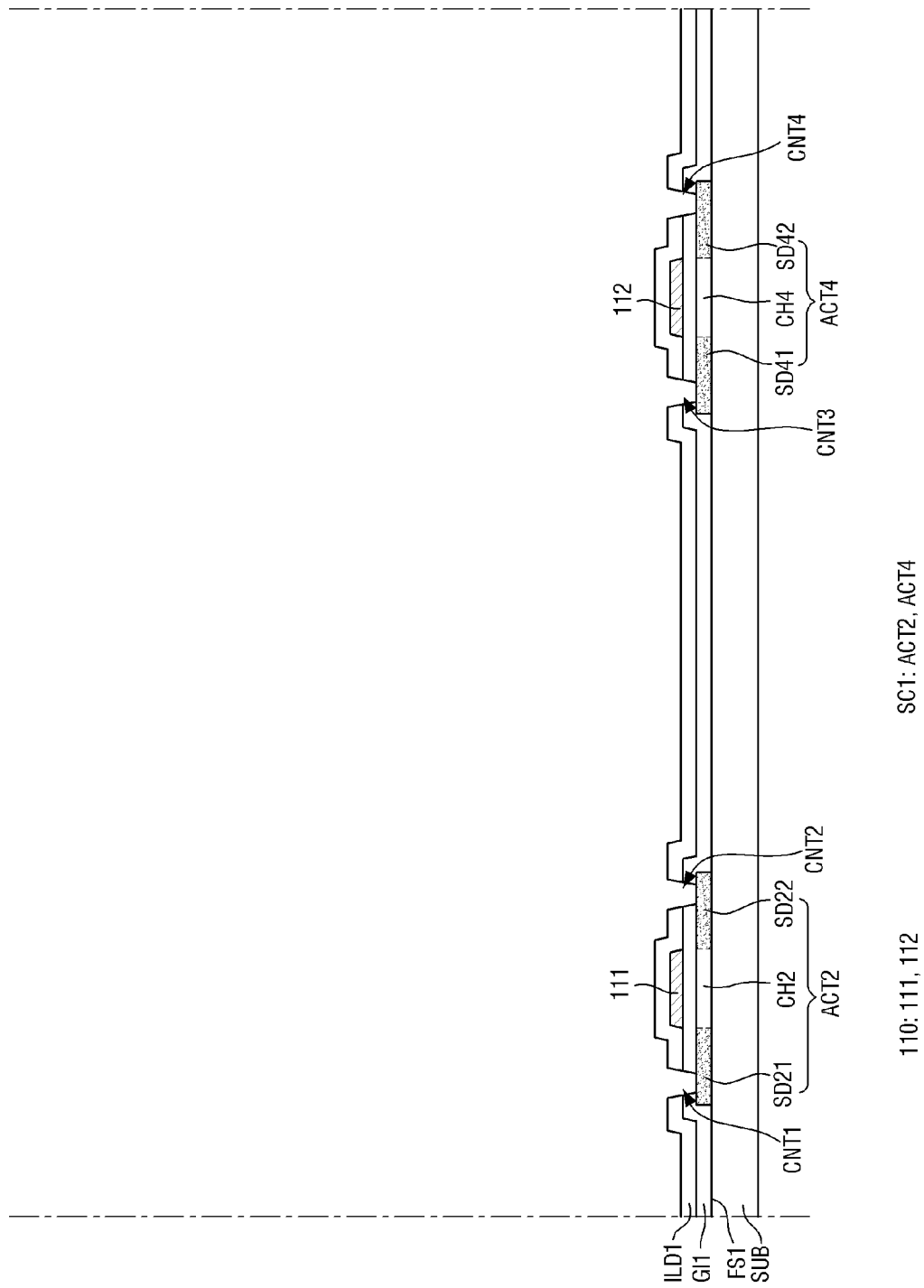

Subsequently, referring to FIG. 8, a first interlayer insulating film ILD1 may be laminated on the first conductive layer 110, and first to fourth contact holes CNT1, CNT2, CNT3, and CNT4 exposing the first semiconductor layer SC1 may be formed.

Specifically, the first to fourth contact holes CNT1, CNT2, CNT3, and CNT4 may be formed by one mask process. The first to fourth contact holes CNT1, CNT2, CNT3, and CNT4 may be simultaneously formed by the same mask. For example, the first interlayer insulating film ILD1 may be entirely deposited on the first gate insulating film GI1 on which the gate electrode 111 of the second transistor T2 and the gate electrode 112 of the fourth transistor T4 may be formed. Subsequently, a photoresist pattern exposing a part of the first interlayer insulating film ILD1 may be formed on the first interlayer insulating film ILD1, and the first interlayer insulating film ILD1 and the first gate insulating film GI1 may be etched using this photoresist pattern as an etching mask to form the first to fourth contact holes CNT1, CNT2, CNT3, and CNT4 exposing a part of the first semiconductor layer SC1.

Figure 9:
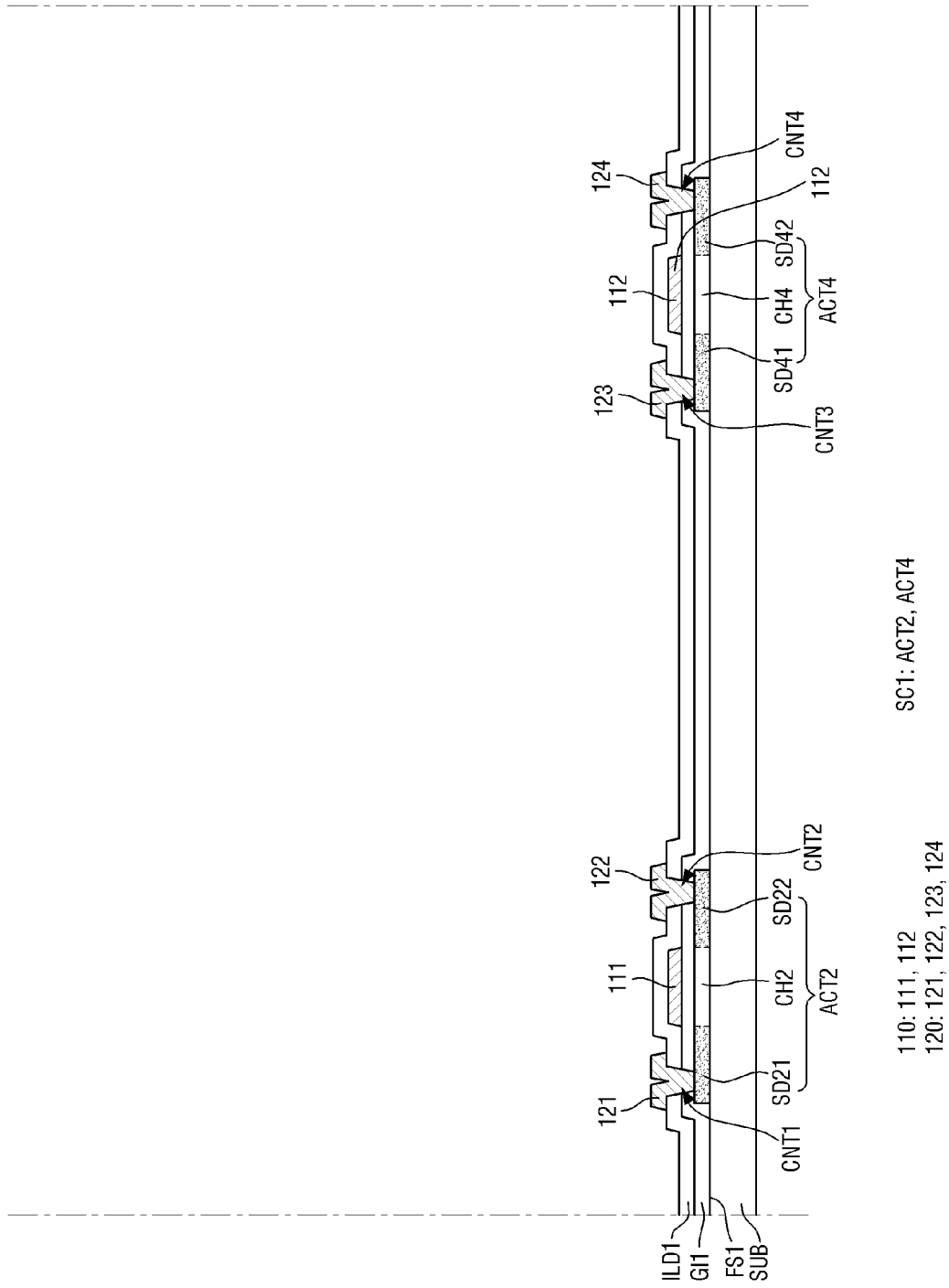

Subsequently, referring to FIG. 9, a second conductive layer 120 including a data line 121, a first conductive pattern 122, a second conductive pattern 123, and an initialization line 124 may be formed on the first interlayer insulating film ILD1.

Specifically, the second conductive layer 120 that may be patterned may be formed by a mask process. For example, a material layer for the second conductive layer may be entirely deposited on the first interlayer insulating film ILD1. In the deposition process, the material layer for the second conductive layer may be deposited to the inside of the first to fourth contact holes CNT1, CNT2, CNT3, and CNT4. Accordingly, each of the data line 121, the first conductive pattern 122, the second conductive pattern 123, and the initialization line 124 may be electrically connected to the first semiconductor layer SC1. Subsequently, a photoresist layer may be applied onto the material layer for the second conductive layer, a photoresist pattern may be formed through exposure and development, and then the material layer for the second conductive layer may be etched using the photoresist pattern as an etching mask. Then, the photoresist pattern may be removed through a stripping or ashing process to complete to the patterned second conductive layer 120 as shown in FIG. 9.

Figure 10:
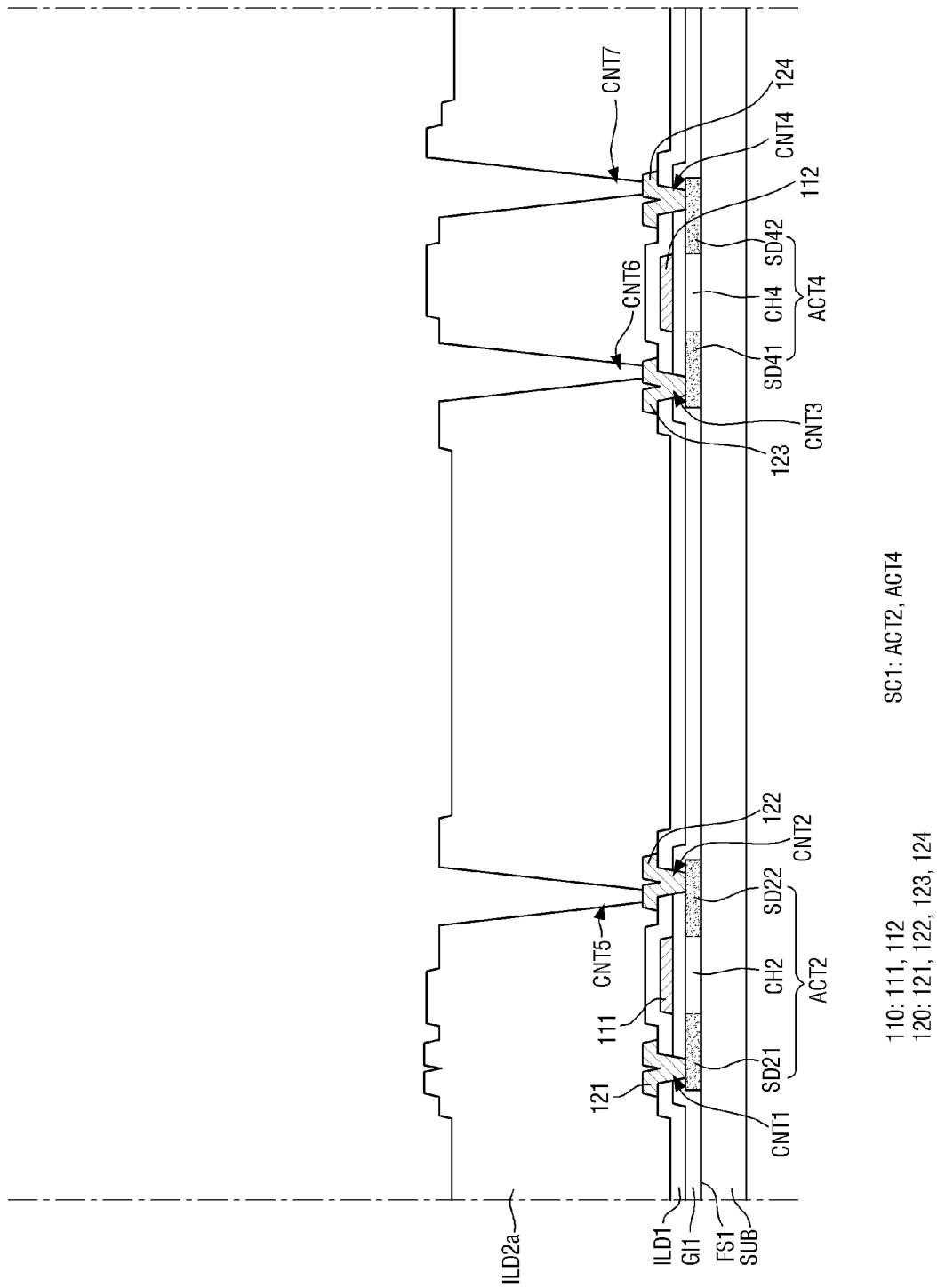
Figure 11:
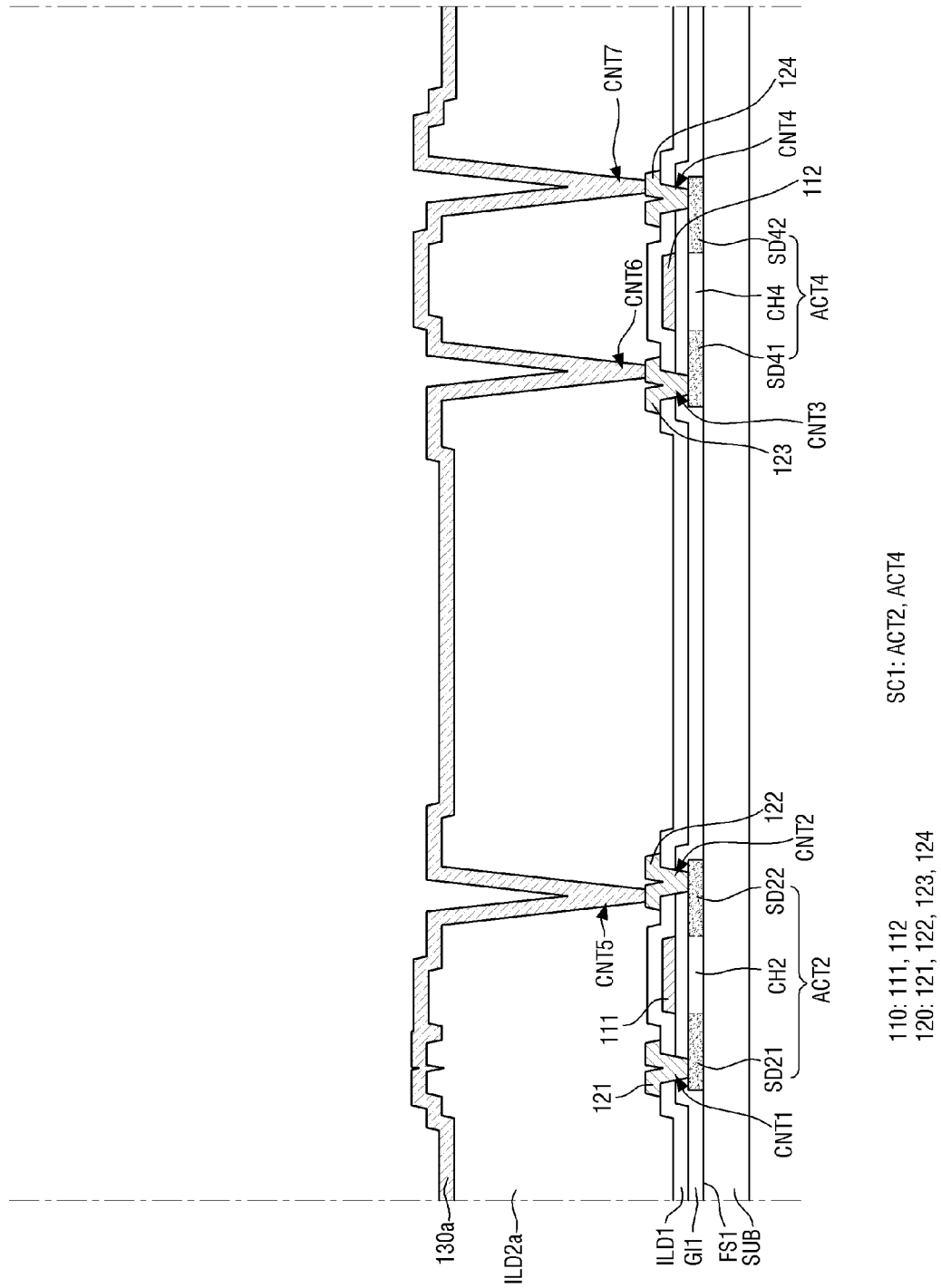
Figure 12:
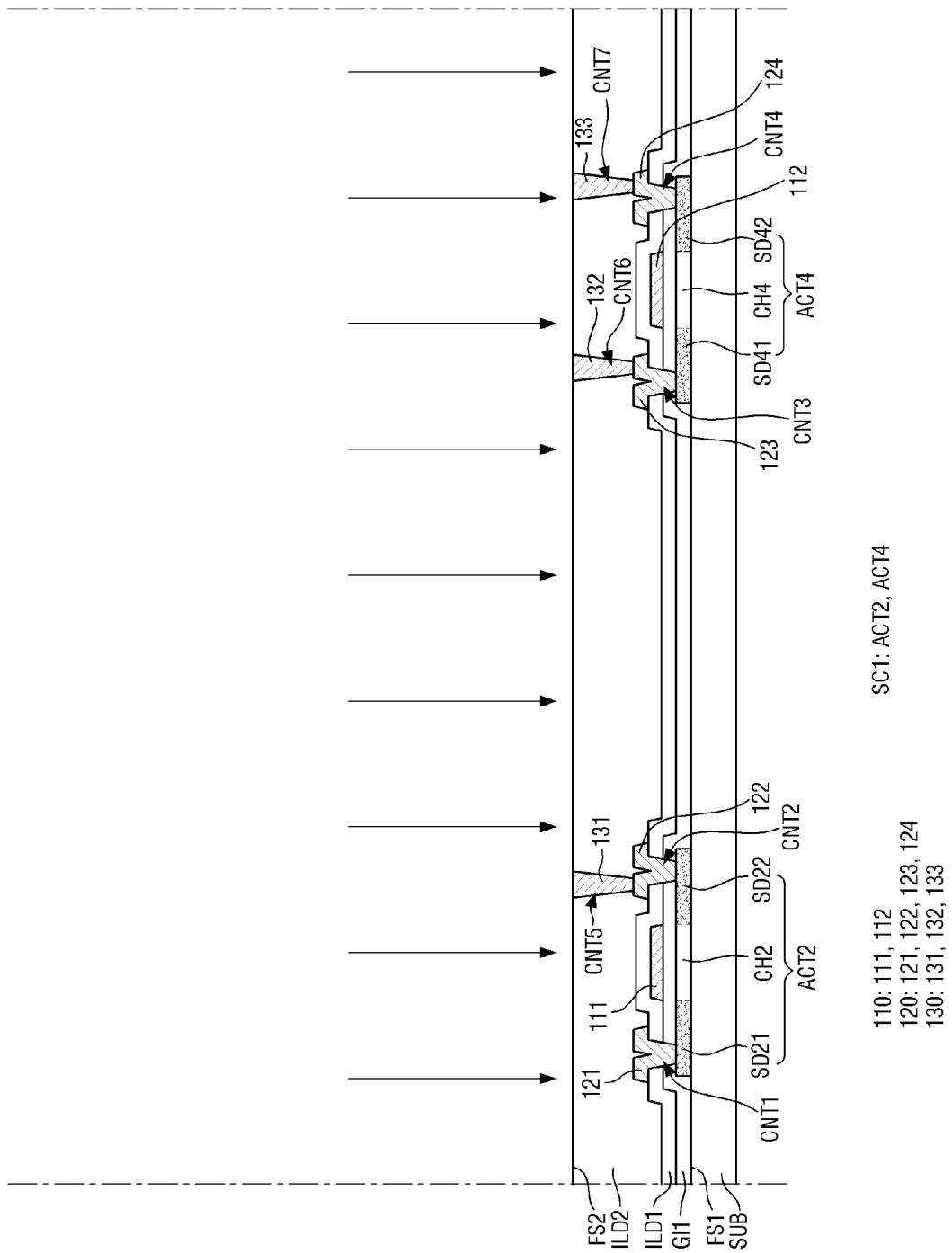

Subsequently, referring to FIGS. 10 to 12, a pre-polishing second interlayer insulating film ILD2a and a pre-polishing third conductive layer 130a may be sequentially formed on the second conductive layer 120 before polishing, and may be flattened to form a second semiconductor arrangement layer FS2.

First, a pre-polishing second interlayer insulating film ILD2a may be formed on the first interlayer insulating film ILD1 provided with the second conductive layer 120, and fifth to seventh contact holes CNT5, CNT6, and CNT7 may be formed to expose the second conductive layer 120. The fifth to seventh contact holes CNT5, CNT6, and CNT7 may be formed by one mask process. For example, the pre-polishing second interlayer insulating film ILD2a may be entirely deposited on the first interlayer insulating film ILD1 provided with the second conductive layer 120. Subsequently, a photoresist pattern exposing a part of the pre-polishing second interlayer insulating film ILD2a may be formed on the pre-polishing second interlayer insulating film ILD2a, and the pre-polishing second interlayer insulating film ILD2a may be etched using the photoresist pattern as an etching mask to form the fifth to seventh contact holes CNT5, CNT6, and CNT7 exposing a part of the second conductive layer 120.

After forming the fifth to seventh contact holes CNT5, CNT6, and CNT7, a pre-polishing third conductive layer 130a may be formed on the pre-polishing second interlayer insulating film ILD2a. The pre-polishing third conductive layer 130a may be formed by a deposition process. For example, a material layer for the third conductive layer may be entirely deposited on the pre-polishing second interlayer insulating film ILD2a. In the deposition process, the material layer for the third conductive layer may be deposited to the inside of the fifth to seventh contact holes CNT5, CNT6, and CNT7. Therefore, the pre-polishing third conductive layer 130a may be electrically connected to the second conductive layer 120, and, after polishing, each of the first contact pattern 131, the second contact pattern 132, and the third contact pattern 133 may be electrically connected to the second conductive layer 120.

After forming the pre-polishing third conductive layer 130a, a second semiconductor arrangement layer FS2 may be formed. The second semiconductor arrangement layer FS2 may be formed by removing a part of the pre-polishing second interlayer insulating film ILD2a and a part of the pre-polishing third conductive layer 130a through chemical mechanical polishing (CMP) to planarize the pre-polishing second interlayer insulating film ILD2a and the pre-polishing third conductive layer 130a. The chemical mechanical polishing process for forming the second semiconductor arrangement layer FS2 may be performed using a slurry required to planarize the pre-polishing second interlayer insulating film ILD2a and the pre-polishing third conductive layer 130a. Through the chemical mechanical polishing, the thickness of the pre-polishing second interlayer insulating film ILD2a may be reduced, and the first contact pattern 131, the second contact pattern 132, and the third contact pattern 133 may be formed. However, the method of planarizing the pre-polishing second interlayer insulating layer ILD2a and the pre-polishing third conductive layer 130a is not limited thereto. In case that the second semiconductor layer SC2 includes an oxide semiconductor, the process of planarizing the second semiconductor arrangement layer FS2 may be omitted.

Figure 13:
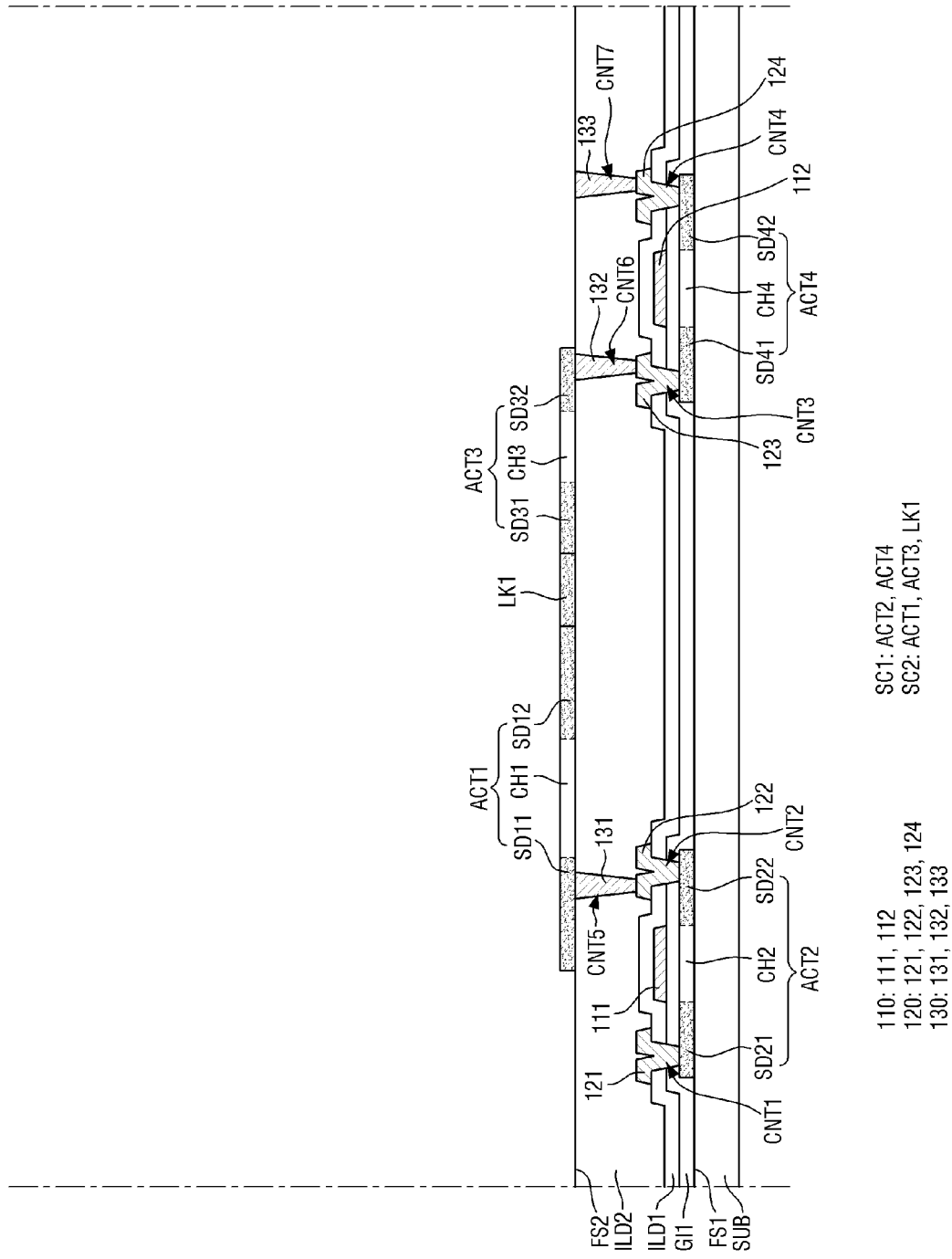

Subsequently, referring to FIG. 13, a patterned second semiconductor layer SC2 may be formed on the second interlayer insulating film ILD2 and the third conductive layer 130. The patterned second semiconductor layer SC2 may be disposed on the second semiconductor arrangement layer FS2. After a material for the second semiconductor layer may be entirely deposited on the second semiconductor arrangement layer FS2, the material for the second semiconductor layer may be patterned through a photolithography process to form the second semiconductor layer SC2 as shown in FIG. 13.

Figure 14:
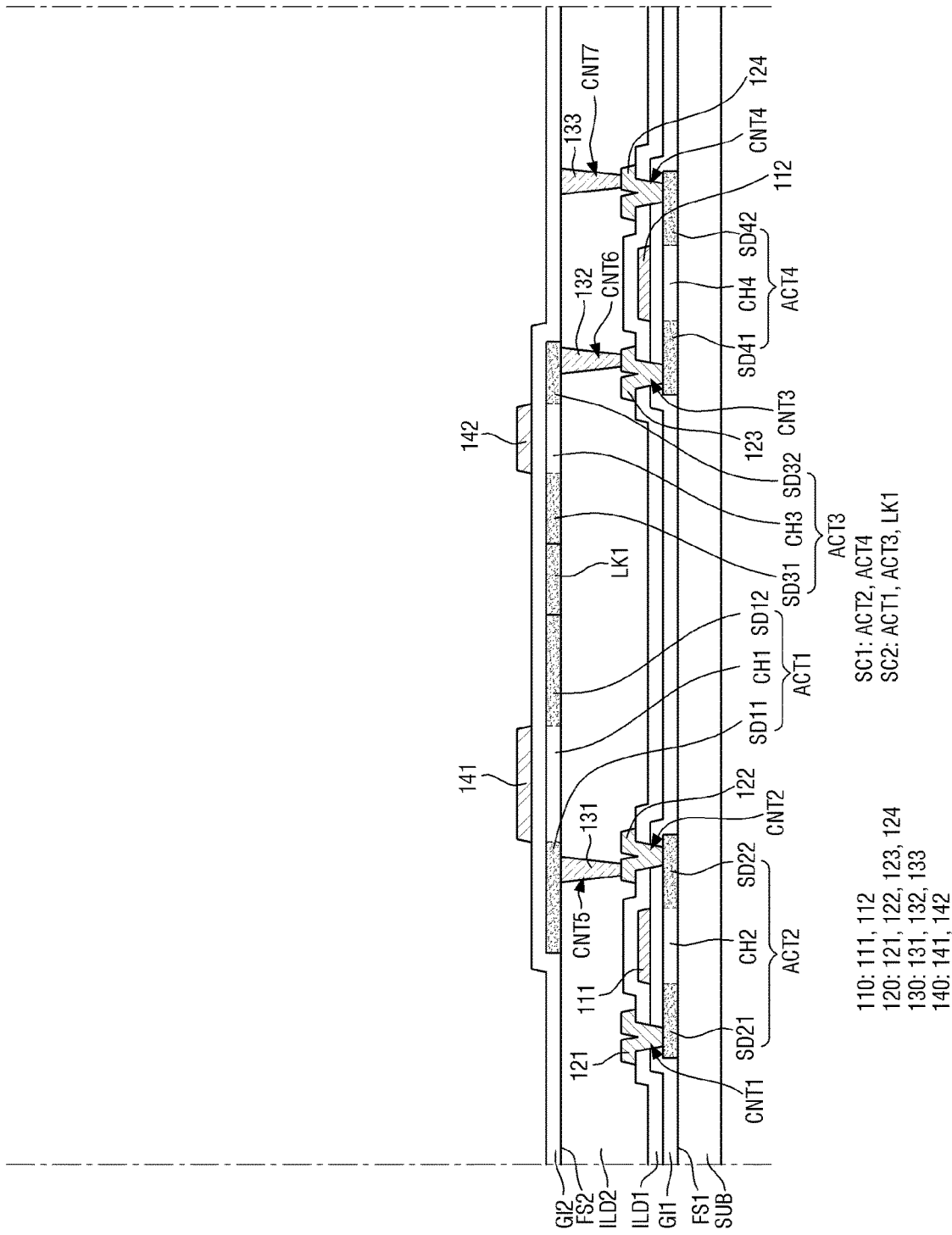

Subsequently, referring to FIG. 14, a second gate insulating film GI2 may be formed on the second semiconductor layer SC2, and a fourth conductive layer 140 including a gate electrode 141 of a first transistor T1 and a gate electrode 142 of a third transistor T3 may be formed on the second gate insulating film GI2.

Specifically, a second gate insulating film GI2 may be formed on the entire surface of the second interlayer insulating film ILD2 on which the second semiconductor layer SC2 may be formed. Subsequently, a gate electrode 141 of a first transistor T1 and a gate electrode 142 of a third transistor T3 may be formed on the second gate insulating film GI2. The gate electrode 141 of the first transistor T1 and the gate electrode 142 of the third transistor T3, which may be patterned, may be formed by one mask process. For example, as shown in FIG. 14, gate electrode 141 of the first transistor T1 and the gate electrode 142 of the third transistor T3 may be formed by entirely depositing a material layer for the fourth conductive layer on the second gate insulating film GI2 and then patterning the material layer for the fourth conductive layer by a photolithography process.

Figure 15:
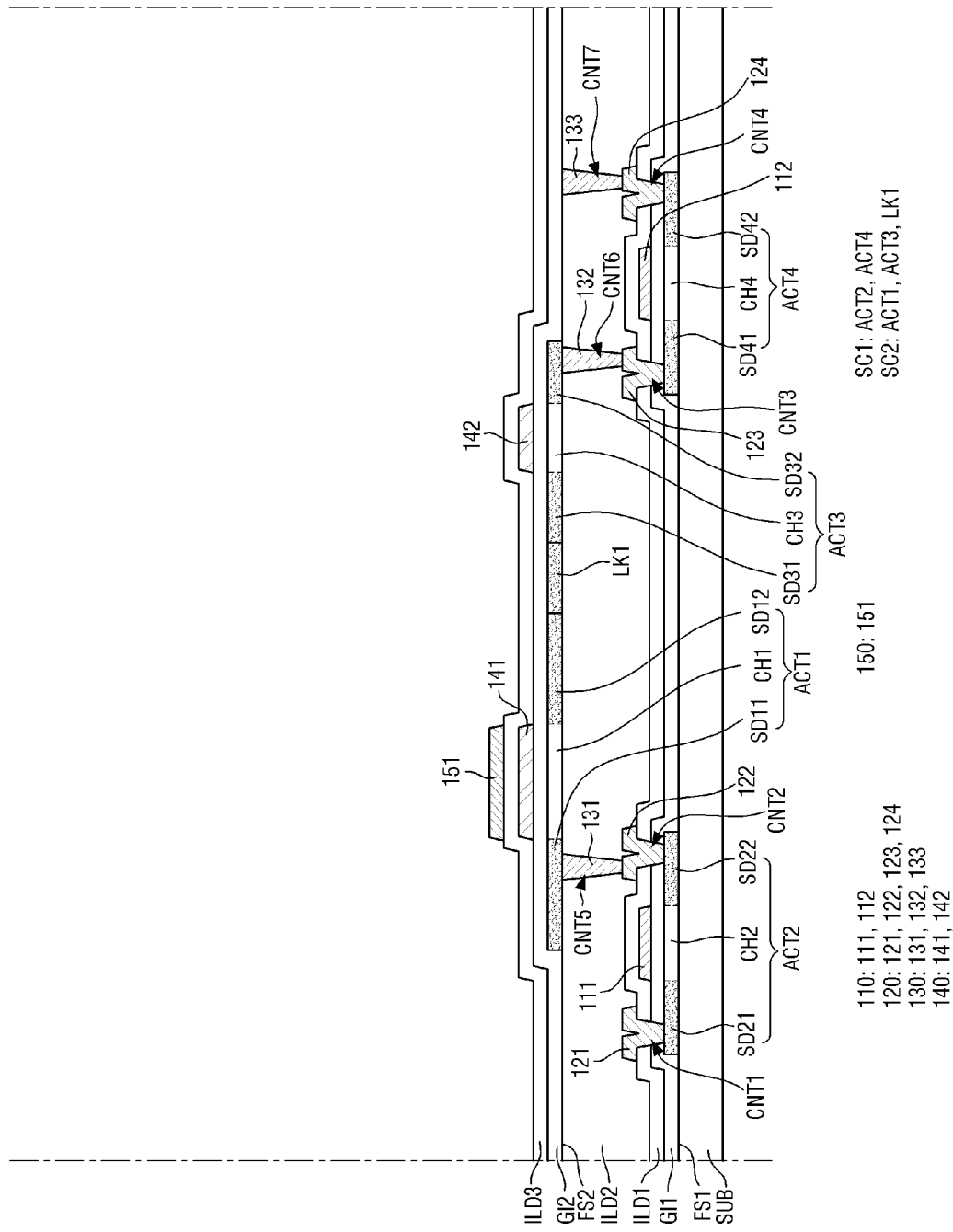

Subsequently, referring to FIG. 15, a third interlayer insulating film ILD3 may be formed on the fourth conductive layer 140, and a fifth conductive layer 150 including a second electrode 151 of a capacitor Cst may be formed on the third interlayer insulating film ILD3.

Specifically, a third interlayer insulating film ILD3 may be formed on the entire surface of the second gate insulating film GI2 on which the fourth conducive layer 140 may be formed. Then, a second electrode 151 of a capacitor Cst may be formed on the third interlayer insulating film ILD3. For example, as shown in FIG. 15, the second electrode 151 of the capacitor Cst may be formed by entirely depositing a material layer for the fifth conductive layer on the third interlayer insulating film ILD3 and then patterning the material layer for the fifth conductive layer by a photolithography process.

Figure 16:
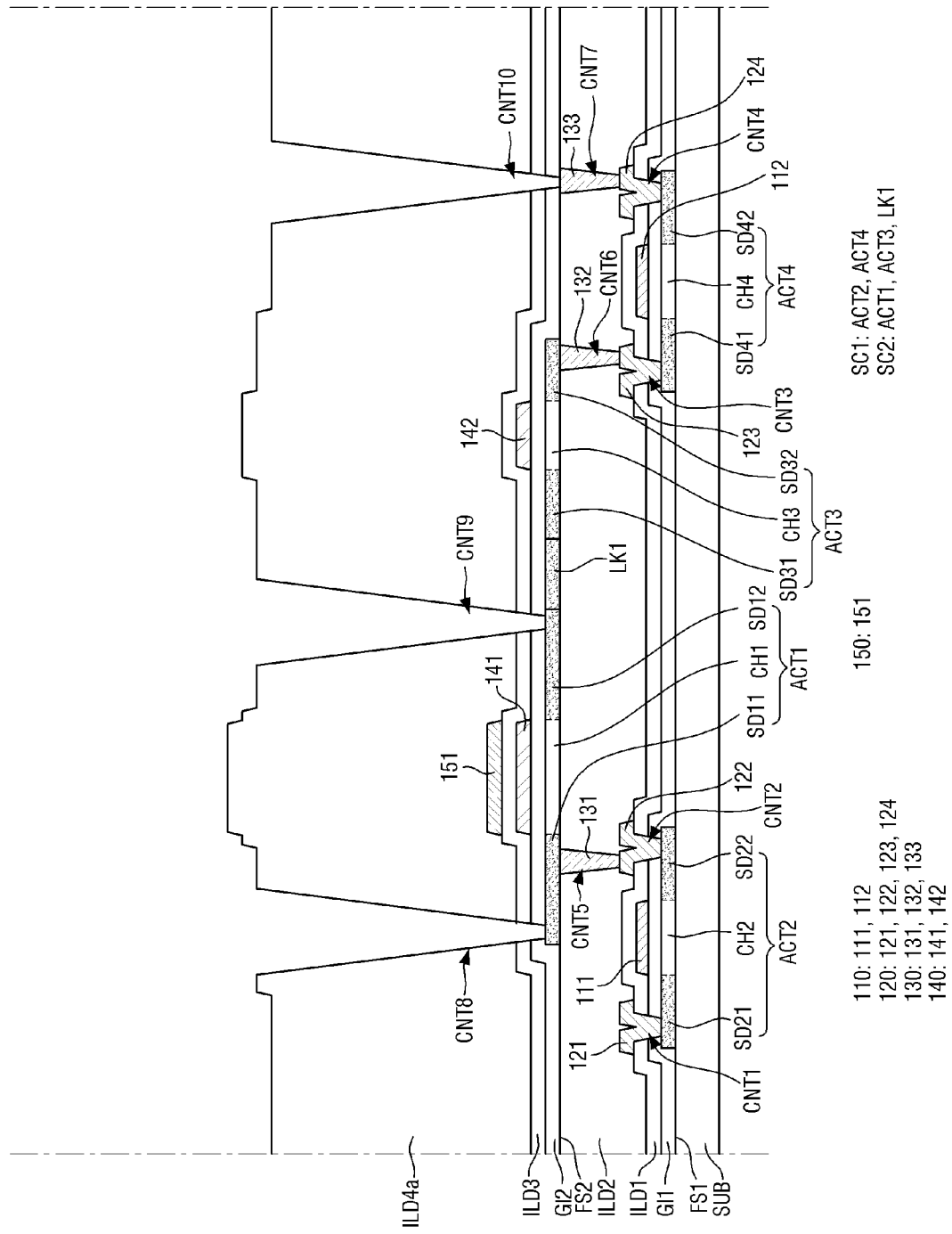
Figure 17:
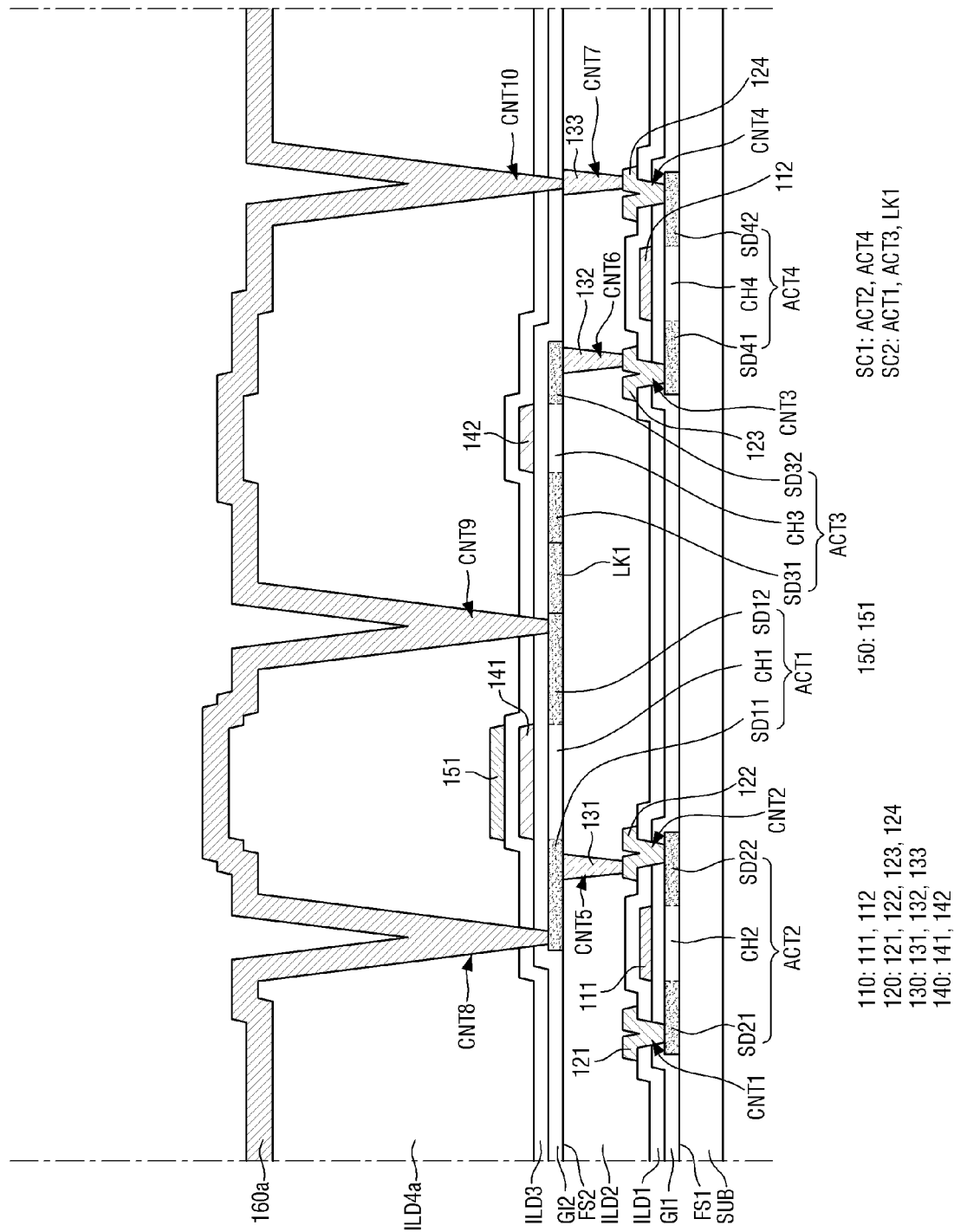
Figure 18:
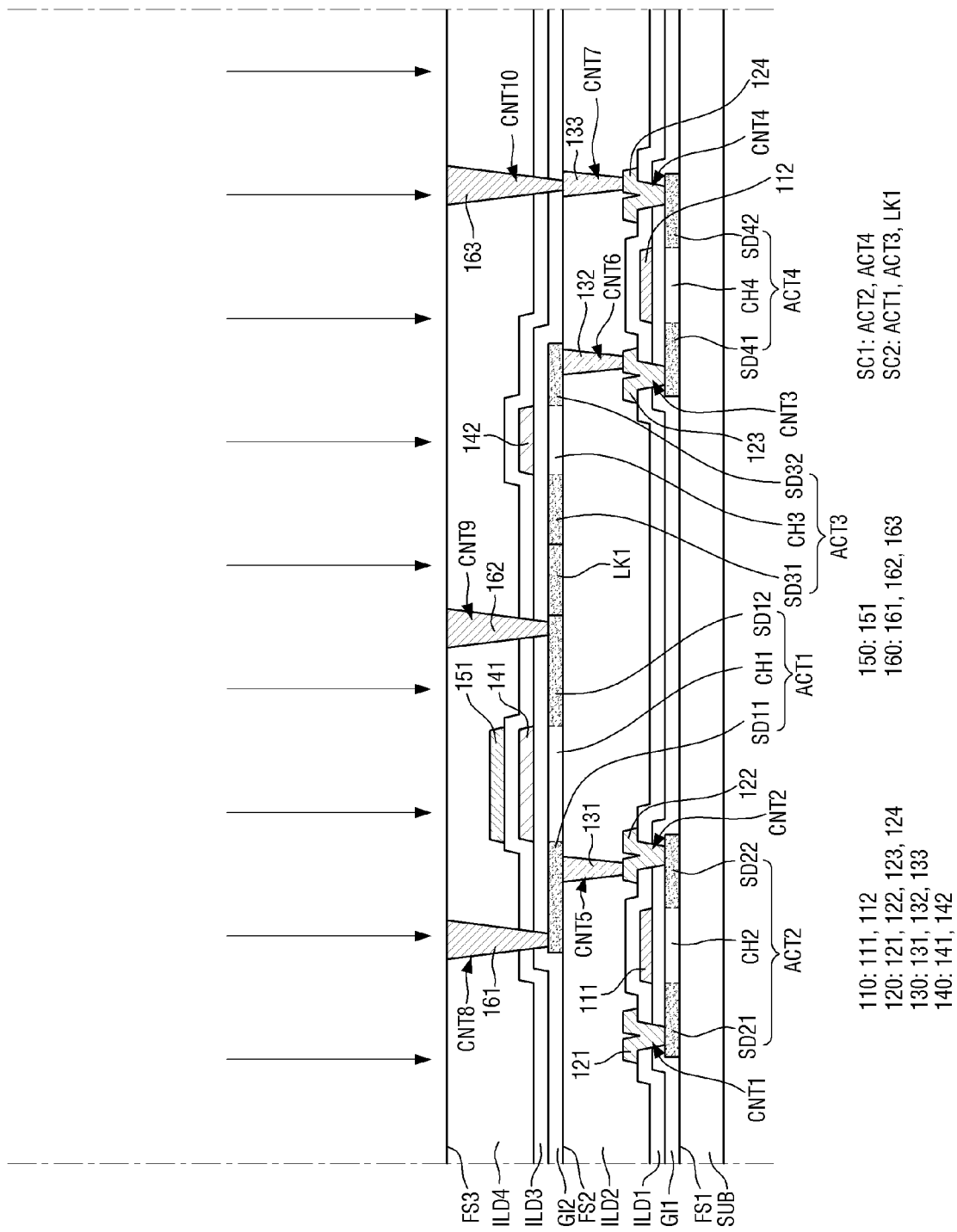

Subsequently, referring to FIGS. 16 to 18, a pre-polishing fourth interlayer insulating film ILD4a and a pre-polishing sixth conductive layer 160a may be sequentially formed on the fifth conductive layer 150, and may be flattened to form a third semiconductor arrangement layer FS3.

First, a pre-polishing fourth interlayer insulating film ILD4a may be formed on the third interlayer insulating film ILD3 provided with the fifth conductive layer 150, and eighth to tenth contact holes CNT8, CNT9, and CNT10 may be formed to expose the second semiconductor layer SC2. The eighth to tenth contact holes CNT8, CNT9, and CNT10 may be formed by one mask process. For example, the pre-polishing fourth interlayer insulating film ILD4a may be entirely deposited on the third interlayer insulating film ILD3 provided with the fifth conductive layer 150. Subsequently, a photoresist pattern exposing a part of the second semiconductor layer SC2 may be formed on the pre-polishing fourth interlayer insulating film ILD4a, and the pre-polishing fourth interlayer insulating film ILD4a may be etched using the photoresist pattern as an etching mask to form the eighth to tenth contact holes CNT8, CNT9, and CNT10 exposing a part of the second semiconductor layer SC2.

After forming the eighth to tenth contact holes CNT8, CNT9, and CNT10, a pre-polishing sixth conductive layer 160a may be formed on the fourth pre-polishing interlayer insulating film ILD4a. The pre-polishing sixth conductive layer 160a may be formed by a deposition process. For example, a material layer for the sixth conductive layer may be entirely deposited on the pre-polishing fourth interlayer insulating film ILD4a. In the deposition process, the material layer for the sixth conductive layer may be deposited to the inside of the eighth to tenth contact holes CNT8, CNT9, and CNT10. Therefore, the pre-polishing sixth conductive layer 160a may be electrically connected to the second semiconductor layer SC2, and, after polishing, each of the fourth contact pattern 161, the fifth contact pattern 162, and the sixth contact pattern 163 may be electrically connected to the second semiconductor layer SC2.

After forming the pre-polishing sixth conductive layer 160a, a third semiconductor arrangement layer FS3 may be formed. The third semiconductor arrangement layer FS3 may be formed by removing a part of the pre-polishing fourth interlayer insulating film ILD4a and a part of the pre-polishing sixth conductive layer 160a through chemical mechanical polishing (CMP) to planarize the pre-polishing fourth interlayer insulating film ILD4a and the pre-polishing sixth conductive layer 160a. The chemical mechanical polishing process for forming the third semiconductor arrangement layer FS3 may be performed using a slurry required to planarize the pre-polishing fourth interlayer insulating film ILD4a and the pre-polishing sixth conductive layer 160a. Through the chemical mechanical polishing, the thickness of the pre-polishing fourth interlayer insulating film ILD4a may be reduced, and the fourth contact pattern 161, the fifth contact pattern 162, and the sixth contact pattern 163 may be formed. However, the method of planarizing the pre-polishing fourth interlayer insulating film ILD4a and the sixth conductive layer 160a is not limited thereto. In case that the second semiconductor layer SC2 includes an oxide semiconductor, the process of planarizing the third semiconductor arrangement layer FS3 may be omitted.

Figure 19:
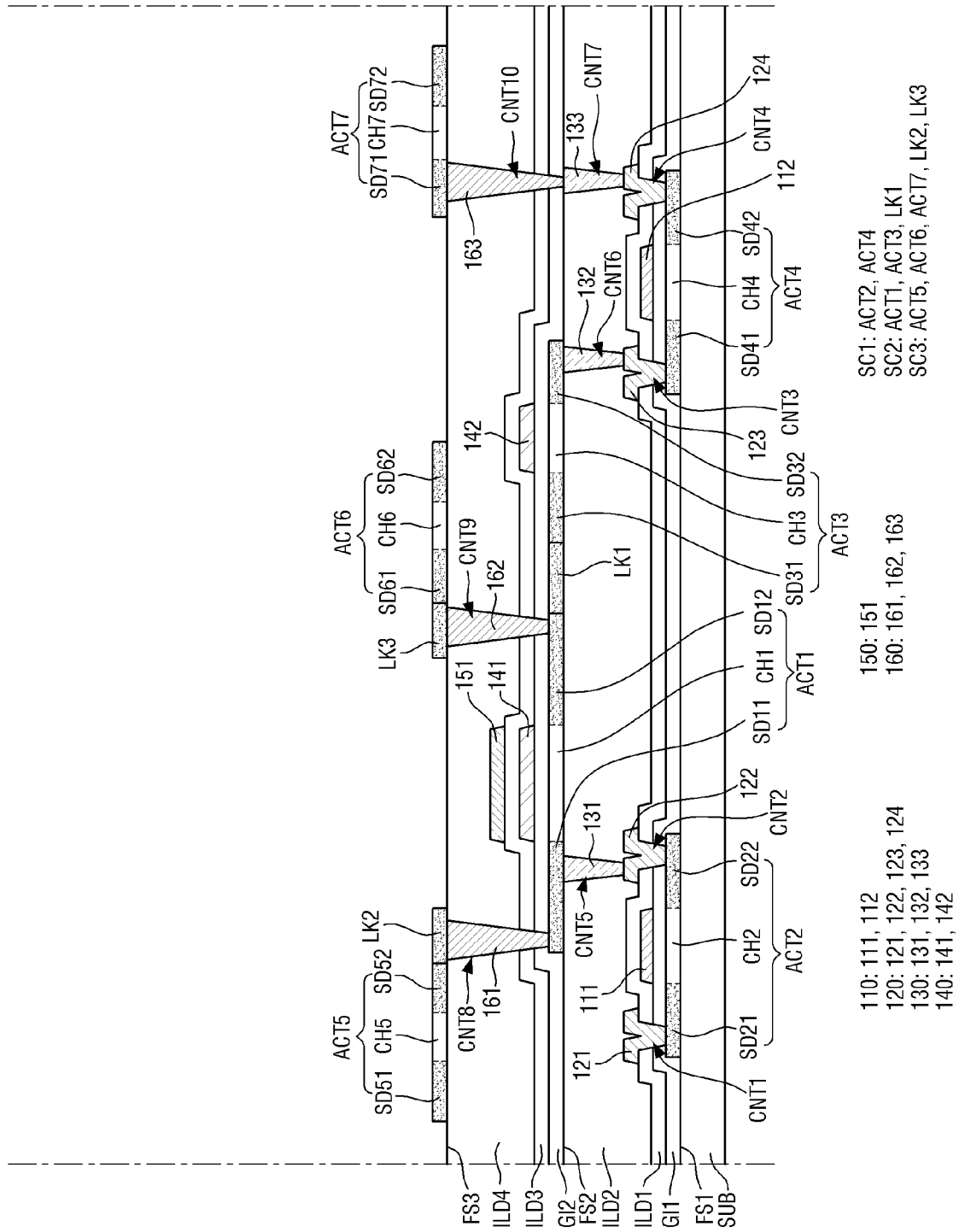

Subsequently, referring to FIG. 19, a patterned third semiconductor layer SC3 may be formed on the fourth interlayer insulating film ILD4 and the sixth conductive layer 160. The patterned third semiconductor layer SC3 may be disposed on the third semiconductor arrangement layer FS3. After a material for the third semiconductor layer may be entirely deposited on the third semiconductor arrangement layer FS3, the material for the third semiconductor layer may be patterned through a photolithography process to form the third semiconductor layer SC3 as shown in FIG. 19.

Figure 20:
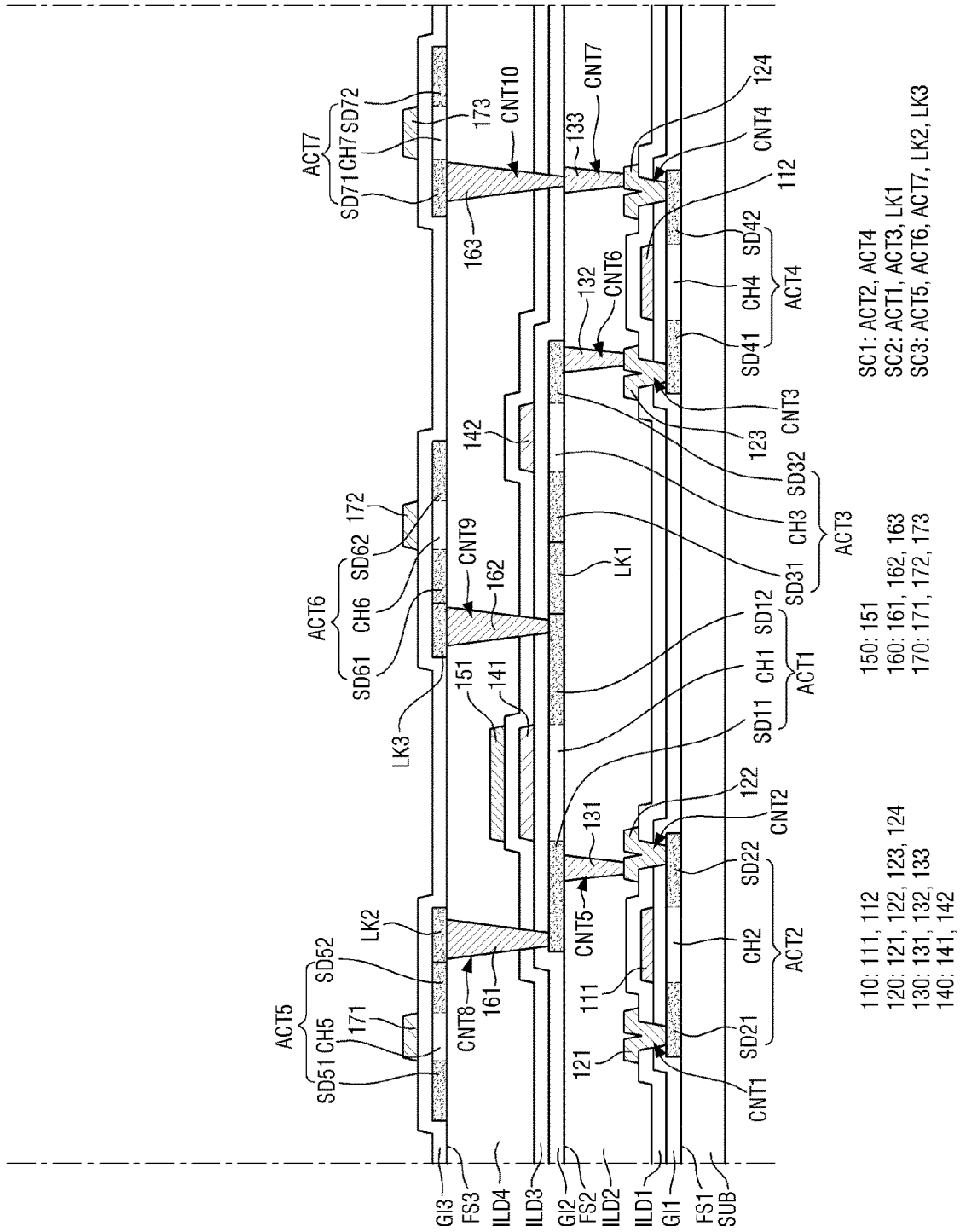

Subsequently, referring to FIG. 20, a third gate insulating film GI3 may be formed on the third semiconductor layer SC3, and a seventh conductive layer 170 including a gate electrode 171 of a fifth transistor T5, a gate electrode 172 of a sixth transistor T6, and a gate electrode 173 of a seventh transistor T7 may be formed on the third gate insulating film GI3.

Specifically, a third gate insulating film GI3 may be formed on the entire surface of the fourth interlayer insulating film ILD4 on which the third semiconductor layer SC3 may be formed. Subsequently, a gate electrode 171 of a fifth transistor T5, a gate electrode 172 of a sixth transistor T6, and a gate electrode 173 of a seventh transistor T7 may be formed on the third gate insulating film GI3. The gate electrode 171 of the fifth transistor T5, the gate electrode 172 of the sixth transistor T6, and the gate electrode 173 of the seventh transistor T7, which may be patterned, may be formed by one mask process. For example, as shown in FIG. 20, the gate electrode 171 of the fifth transistor T5, the gate electrode 172 of the sixth transistor T6, and the gate electrode 173 of the seventh transistor T7 may be formed by entirely depositing a material layer for the seventh conductive layer on the third gate insulating film GI3 and then patterning the material layer for the seventh conductive layer by a photolithography process.

Figure 21:
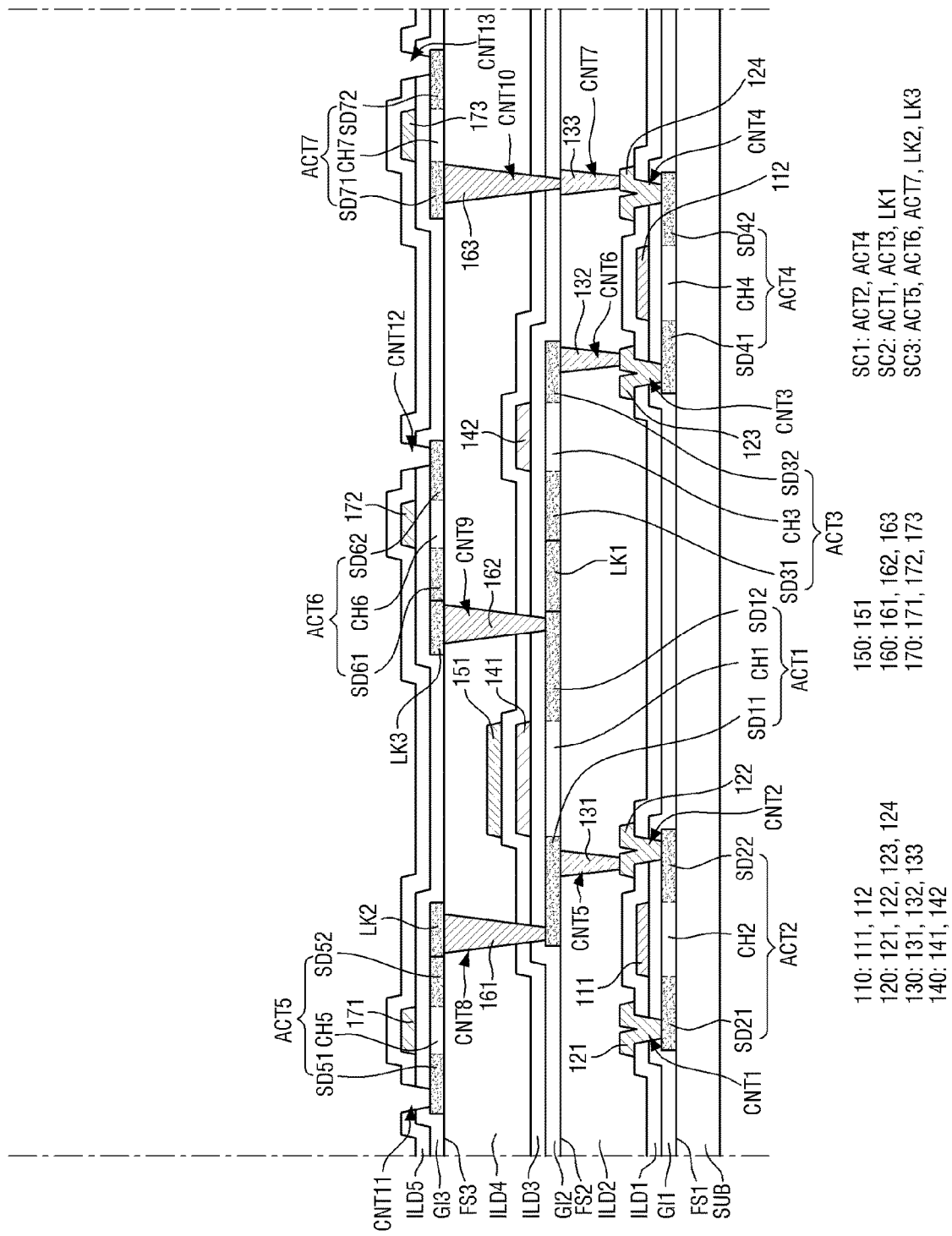

Subsequently, referring to FIG. 21, a fifth interlayer insulating film ILD5 may be laminated on the seventh conductive layer 170, and eleventh to thirteenth contact holes CNT11, CNT12, and CNT13 exposing the third semiconductor layer SC3 may be formed.

Specifically, the eleventh to thirteenth contact holes CNT11, CNT12, and CNT13 may be formed by one mask process. The eleventh to thirteenth contact holes CNT11, CNT12, and CNT13 may be simultaneously formed by the same mask. For example, the fifth interlayer insulating film ILD5 may be entirely deposited on the third gate insulating film GI3 on which the gate electrode 171 of the fifth transistor T5, the gate electrode 172 of the sixth transistor T6, and the gate electrode 173 of the seventh transistor T7 may be formed. Subsequently, a photoresist pattern exposing a part of the fifth interlayer insulating film ILD5 may be formed on the fifth interlayer insulating film ILD5, and the fifth interlayer insulating film ILD5 and the third gate insulating film GI3 may be etched using this photoresist pattern as an etching mask to form the eleventh to thirteenth contact holes CNT11, CNT12, and CNT13 exposing a part of the third semiconductor layer SC3.

Figure 22:
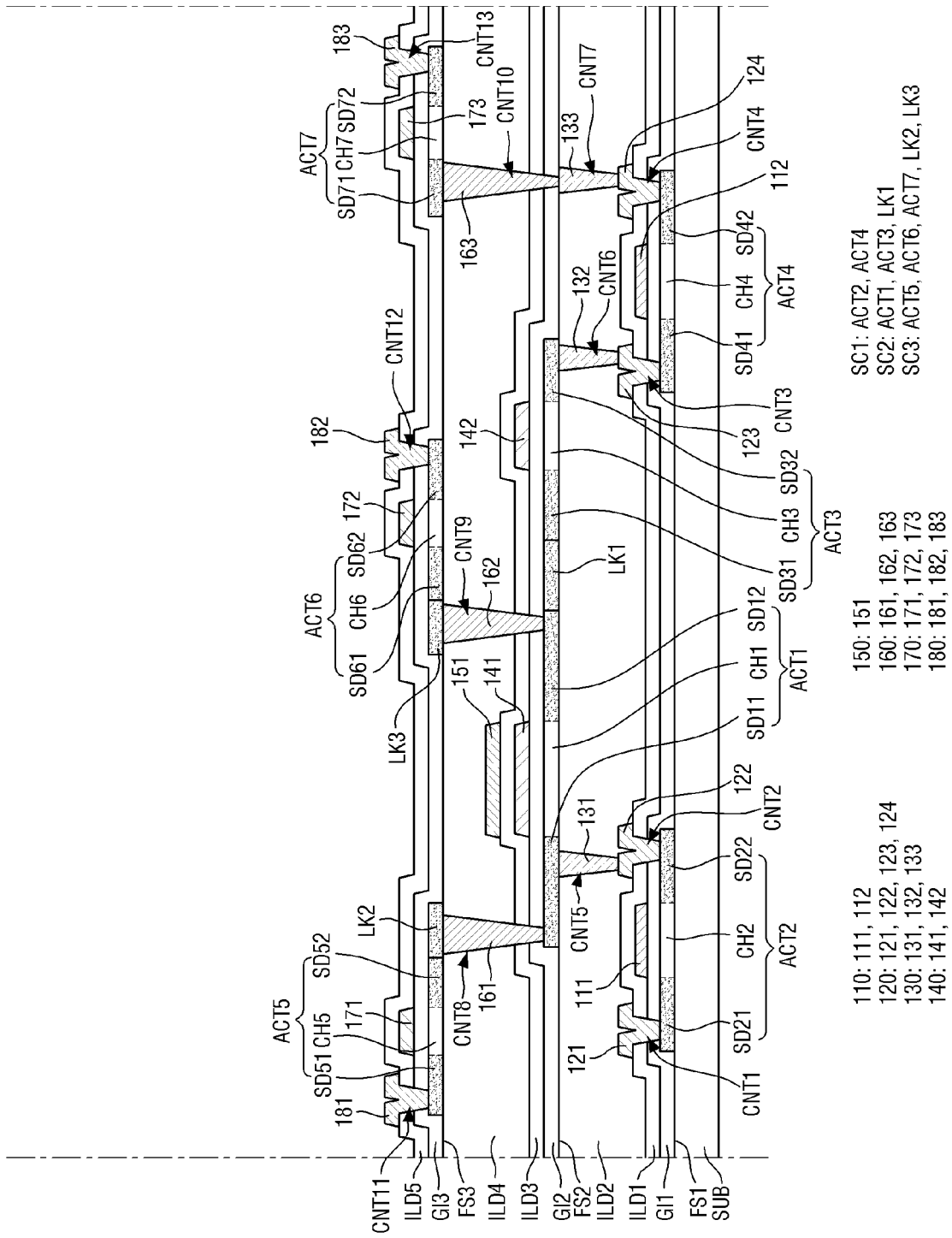

Subsequently, referring to FIG. 22, an eighth conductive layer 180 including a first power voltage line 181, a third conductive pattern 182, and a fourth conductive pattern 183 may be formed on the fifth interlayer insulating film ILD5.

Specifically, the patterned eighth conductive layer 180 may be formed by a mask process. For example, a material layer for the eighth conductive layer may be entirely deposited on the fifth interlayer insulating film ILD5. In the deposition process, the material layer for the eighth conductive layer may be deposited to the inside of the eleventh to thirteenth contact holes CNT11, CNT12, and CNT13. Accordingly, each of the first power voltage line 181, the third conductive pattern 182, and the fourth conductive pattern 183 may be electrically connected to the third semiconductor layer SC3. Subsequently, a photoresist layer may be applied onto the material layer for the eighth conductive layer, a photoresist pattern may be formed through exposure and development, and then the material layer for the eighth conductive layer may be etched using the photoresist pattern as an etching mask. Then, the photoresist pattern may be removed through a stripping or ashing process to complete to the patterned eighth conductive layer 180 as shown in FIG. 22.

Figure 23:
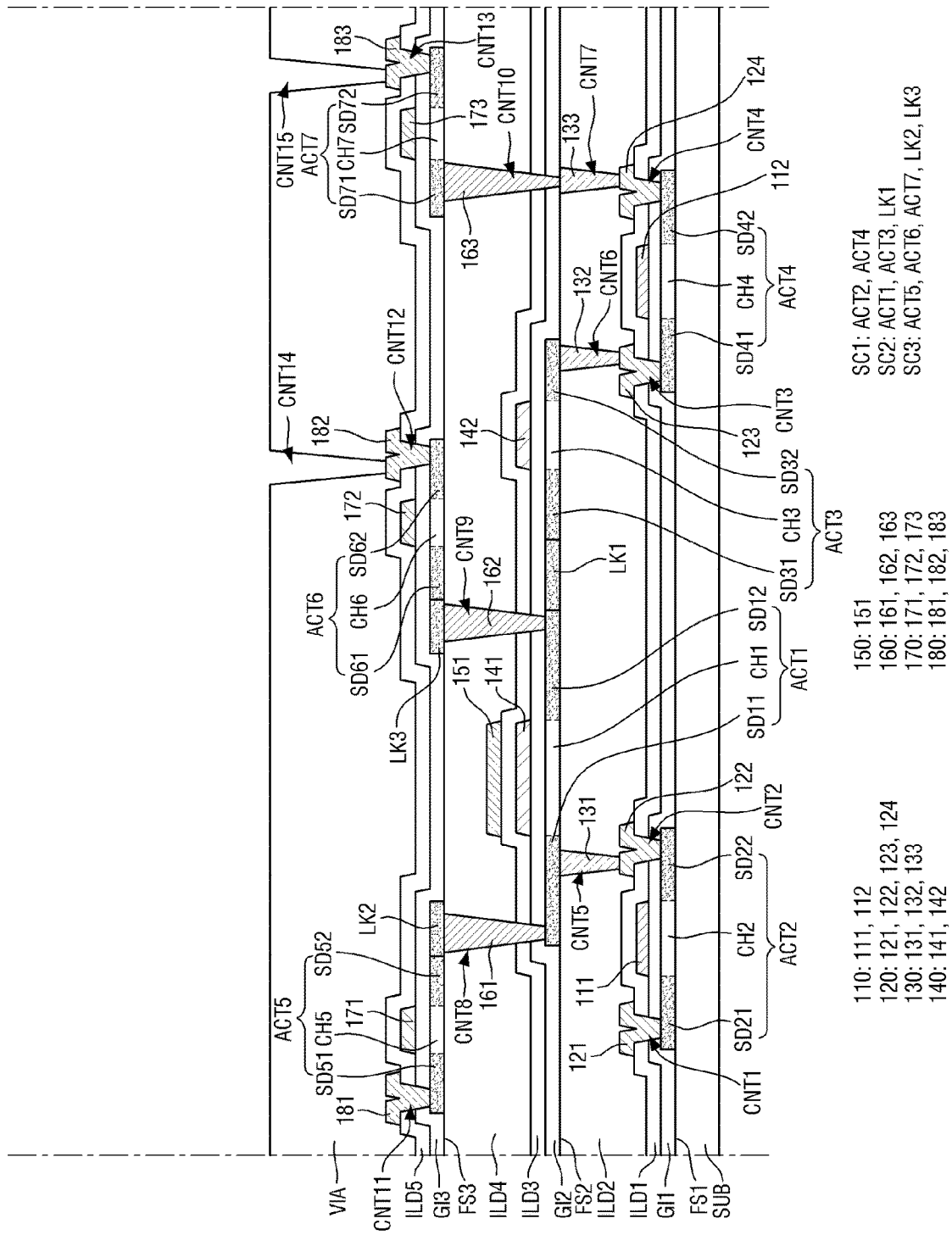

Subsequently, referring to FIG. 23, a via layer VIA may be laminated on the eighth conductive layer 180, and fourteenth and fifteenth contact holes CNT14 and CNT15 exposing the eighth conductive layer 180 may be formed.

Specifically, the fourteenth and fifteenth contact holes CNT14 and CNT15 may be formed by one mask process. The fourteenth and fifteenth contact holes CNT14 and CNT15 may be simultaneously formed by the same mask. For example, the via layer VIA may be entirely deposited on the fifth interlayer insulating film ILD5 on which the first power voltage line 181, the third conductive pattern 182, and the fourth conductive pattern 183 may be formed. Subsequently, a photoresist pattern exposing a part of the via layer VIA may be formed on the via layer VIA, and the via layer VIA may be etched using this photoresist pattern as an etching mask to form the fourteenth and fifteenth contact holes CNT14 and CNT15 exposing a part of the eighth conductive layer 180.

Figure 24:
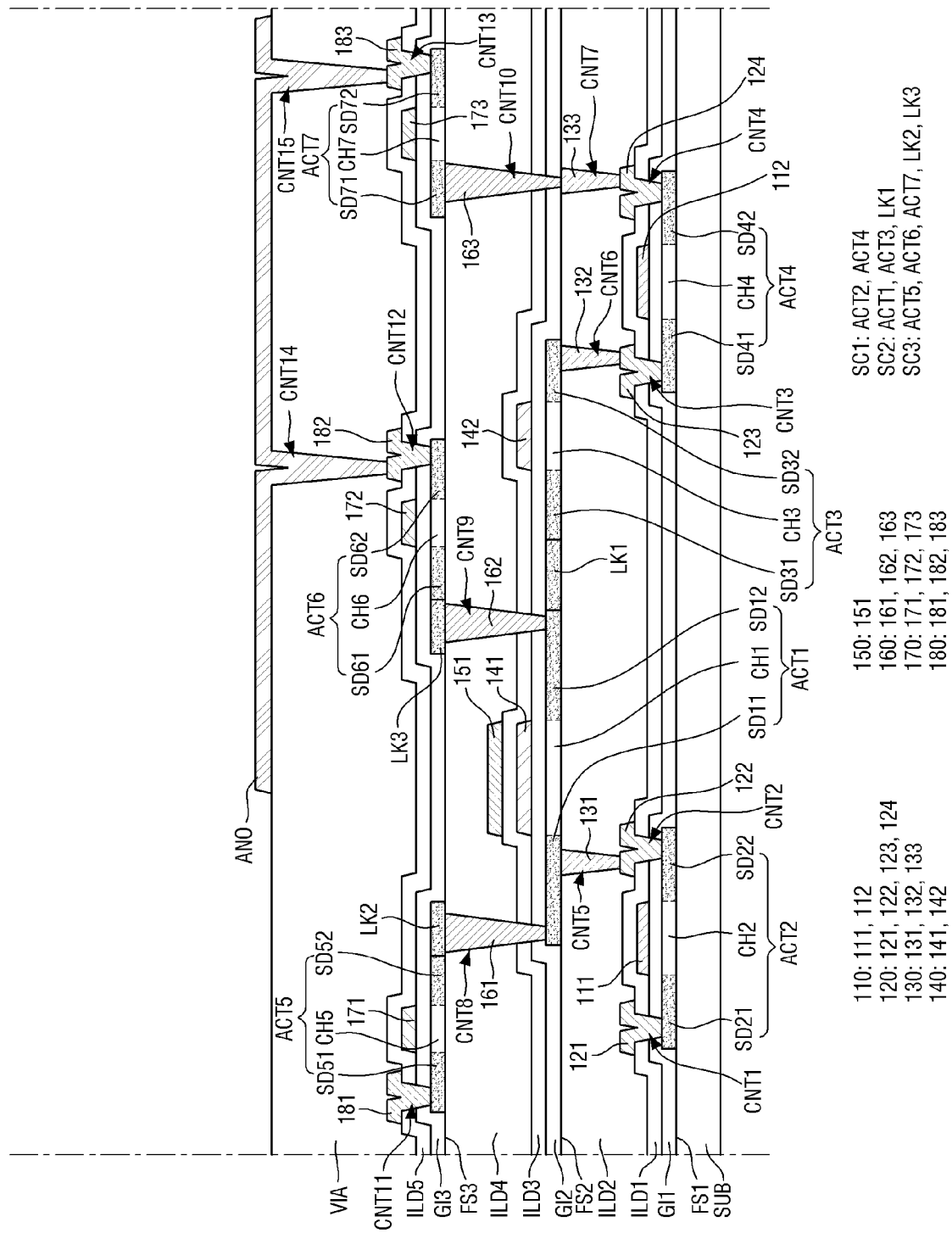

Subsequently, referring to FIG. 24, an anode electrode ANO may be formed on the via layer VIA.

Specifically, the anode electrode ANO may be formed by one mask process. For example, a material layer for the anode electrode may be entirely deposited on the via layer VIA. In the deposition process, the material layer for the anode electrode may be deposited to the inside of the fourteenth and fifteenth contact holes CNT14 and CNT15. Accordingly, anode electrode ANO may be connected to the third conductive pattern 182 and the fourth conductive pattern 183. Subsequently, a photoresist layer may be applied onto the material layer for the anode electrode, a photoresist pattern may be formed through exposure and development, and then the material layer for the anode electrode may be etched using the photoresist pattern as an etching mask. Then, the photoresist pattern may be removed through a stripping or ashing process to complete to the patterned anode electrode ANO as shown in FIG. 24.

Figure 25:
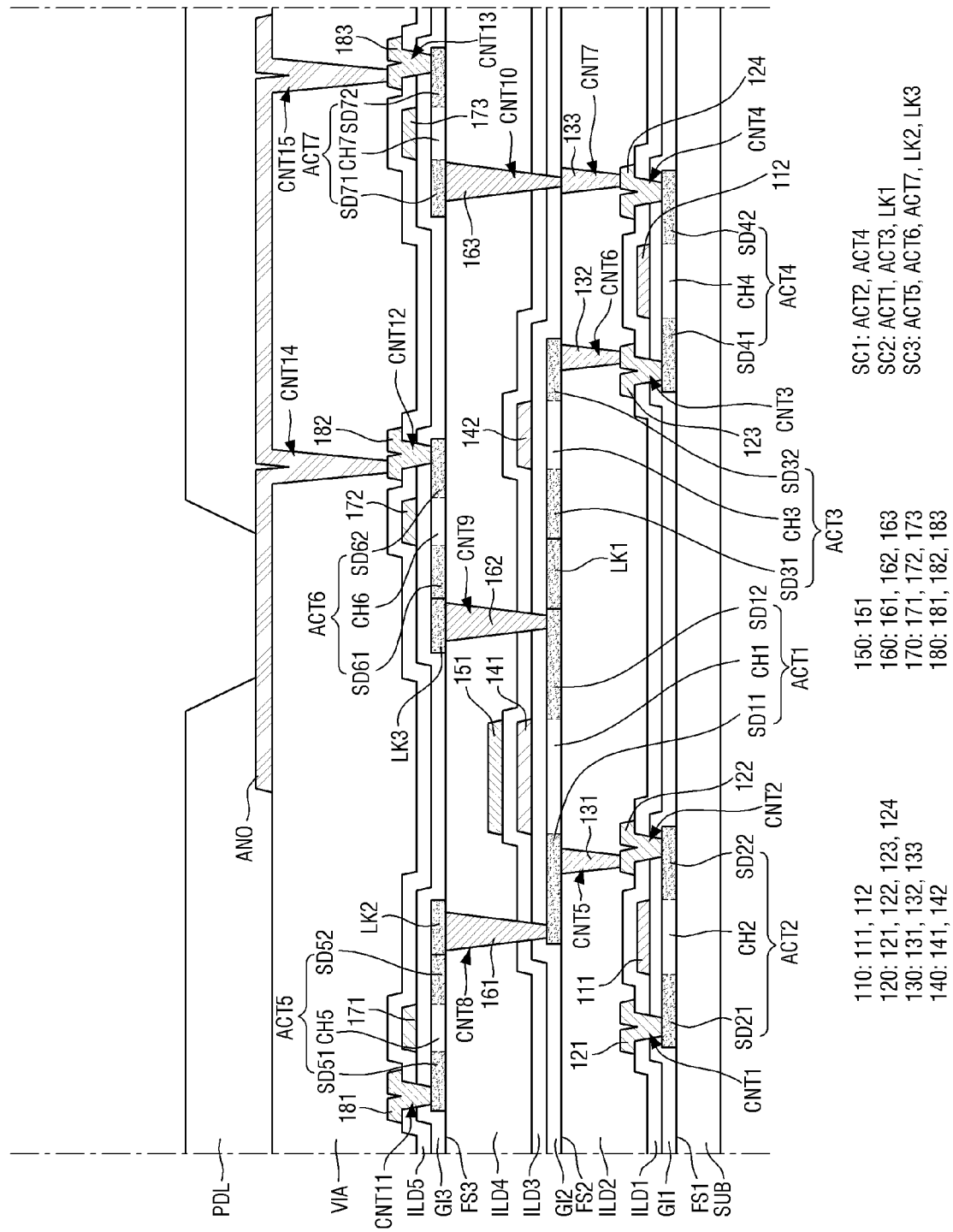

Subsequently, referring to FIG. 25, a patterned pixel defining layer PDL may be formed on the via layer VIA on which the anode electrode ANO may be formed.

The pixel defining layer PDL may include, for example, an organic material including a photosensitive material. The patterned pixel defining layer PDL may be formed by applying an organic material layer for a bank layer and then exposing and developing the organic material layer.

The pixel defining layer PDL may be formed along the boundary of the pixel PX, and may partially overlap the anode electrode ANO. The pixel defining layer PDL may be formed to overlap the fourteenth and fifteenth contact holes CNT14 and CNT15. In case that the anode electrode ANO does not completely fill the inner spaces of the fourteenth and fifteenth contact holes CNT14 and CNT15 and only partially fills them, the pixel defining layer PDL may completely fill the inner spaces of the fourteenth and fifteenth contact holes CNT14 and CNT15.

A light emitting layer EL, a cathode electrode CAT, and a thin film encapsulation layer 190 may be further disposed on the pixel defining layer PDL, but a method of manufacturing the same is widely known, and thus a detailed description is omitted.

Hereinafter, other embodiments will be described. In the following embodiments, for the same components as those previously described, a duplicate description is omitted or simplified, and differences will be described.

Figure 26:
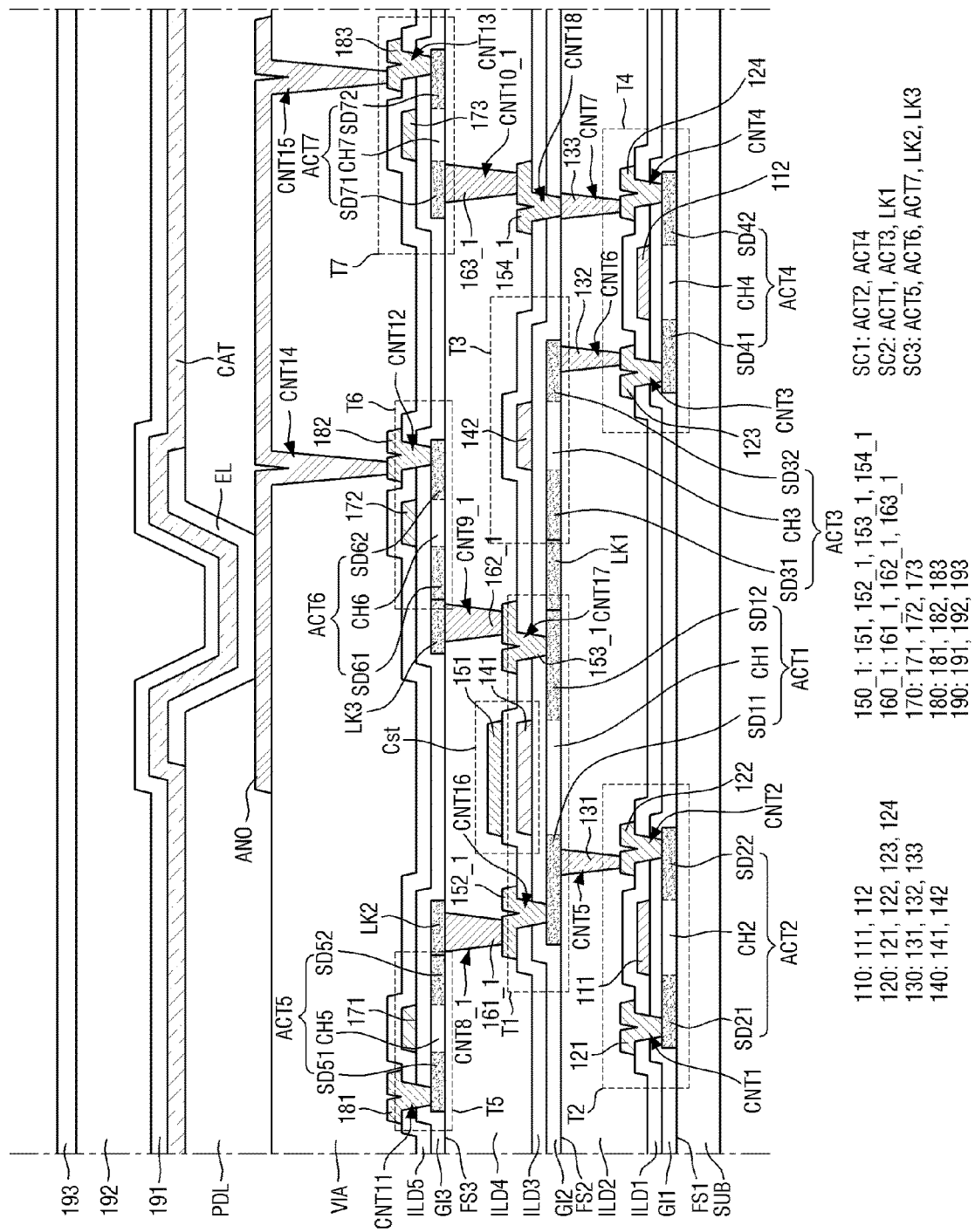
FIG. 26 is a schematic cross-sectional view of a pixel according to another embodiment.

FIG. 26 is a schematic cross-sectional view of a pixel according to another embodiment.

Referring to FIG. 26, a display device of the embodiment may be different from the display device of the embodiment of FIG. 5 in that conductive patterns 152_1, 153_1, and 154_1 may be further disposed to be electrically connected between the second source/drain region SD52 of the fifth transistor T5 and the first source/drain region SD11 of the first transistor T1, between the first source/drain region SD61 of the sixth transistor T6 and the second source/drain region SD12 of the first transistor T1, and between the first source/drain region SD71 of the seventh transistor T7 and the second source/drain region SD32 of the third transistor T3.

Specifically, the display device according to the embodiment may further include a fifth conductive pattern 152_1, a sixth conductive pattern 153_1 and a seventh conductive pattern 154_1. Although not limited thereto, the fifth conductive pattern 152_1, the sixth conductive pattern 153_1, and the seventh conductive pattern 154_1 may be included in the fifth conductive layer 150_1, and may be formed together with the second electrode of the capacitor Cst 151.

The fifth conductive pattern 152_1, the sixth conductive pattern 153_1, and the seventh conductive pattern 154_1 may be electrically connected to the second semiconductor layer SC2 through sixteenth to eighteenth contact holes CNT16, CNT17, and CNT18 that penetrate the third interlayer insulating film ILD3 and the second gate insulating film GI2 to expose the second semiconductor layer SC2. As the fifth conductive pattern 152_1, the sixth conductive pattern 153_1, and the seventh conductive pattern 154_1 may be further disposed, the lengths of the eighth to tenth contact holes CNT8_1, CNT9_1, and CNT10_1 in the thickness direction (third direction DR3) may be reduced, the fifth conductive layer 150_1 may be exposed, and the fourth to sixth contact patterns 161_1, 162_1, and 163_1 may be electrically connected to the fifth conductive layer 150_1. Accordingly, the second source/drain region SD52 of the fifth transistor T5 and the first source/drain region SD11 of the first transistor T1 may be electrically connected to each other by the fourth contact pattern 161_1 and the fifth conductive pattern 152_1, the first source/drain region SD61 of the sixth transistor T6 and the second source/drain region SD12 of the first transistor T1 may be electrically connected to each other by the fifth contact pattern 162_1 and the sixth conductive pattern 153_1, and the first source/drain region SD71 of the seventh transistor T7 and the second source/drain region SD42 of the fourth transistor T4 may be electrically connected to each other by the sixth contact pattern 163_1, the sixth conductive pattern 154_1, and the initialization line 124.

Even in this case, the area of the plane in which the transistors T1 to T7 of one pixel may be disposed may decrease, and thus the display device may implement a higher resolution. Moreover, the lengths of some contact holes in the thickness direction (third direction DR3) may decrease, and thus conductive layers may be more easily formed in the contact holes. Therefore, the electrical connection among the transistors T1 to T7 may be more stable.

Figure 27:
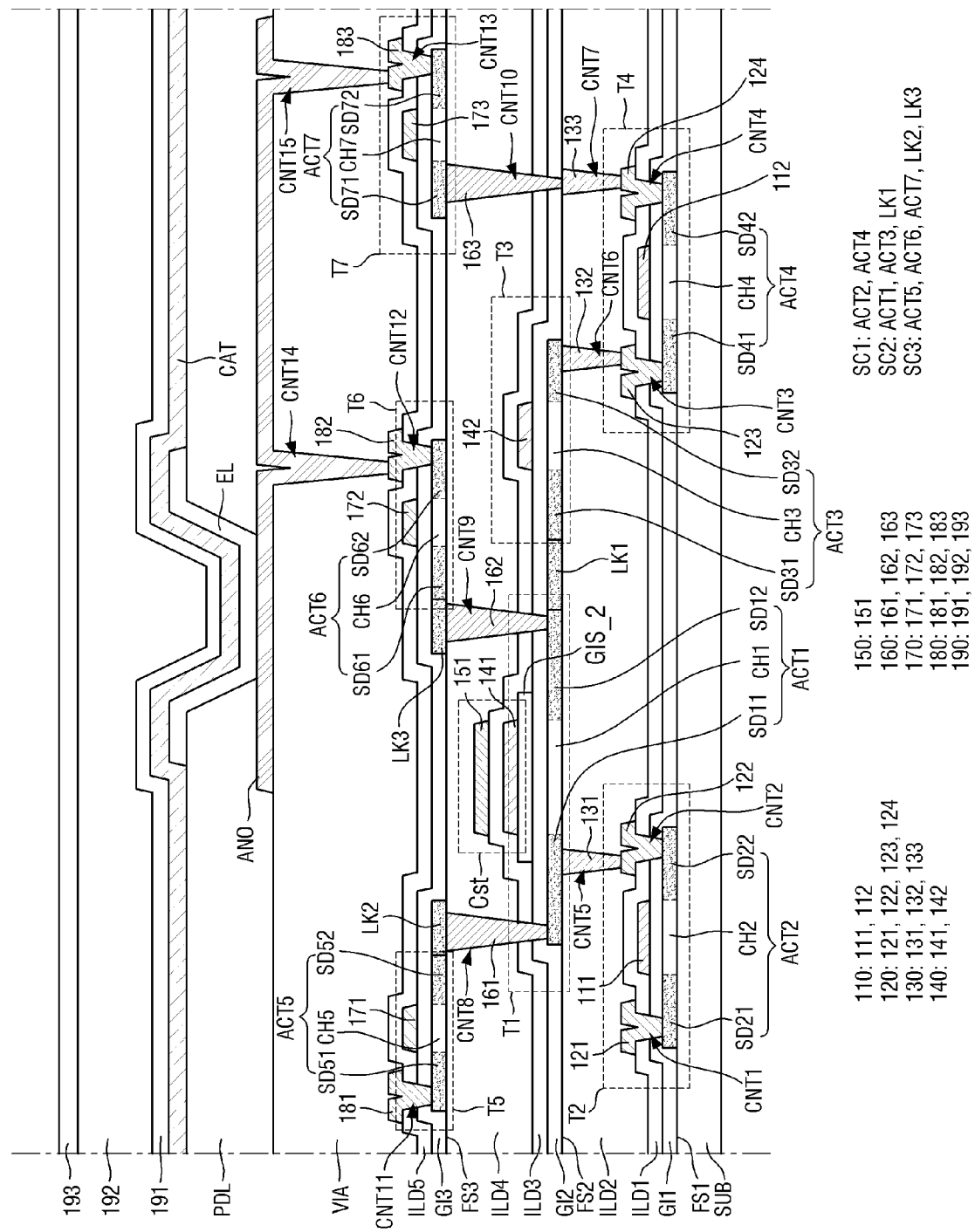
FIG. 27 is a schematic cross-sectional view of a pixel according to another embodiment.

FIG. 27 is a schematic cross-sectional view of a pixel according to another embodiment.

Referring to FIG. 27, a display device of the embodiment may be different from the display device of the embodiment of FIG. 5 in that a sub-gate insulating film GIS_2 may be further disposed on the second gate insulating film GI2.

Specifically, the display device according to the embodiment may further include a sub-gate insulating layer GIS_2 between the gate electrode 141 of the first transistor T1 and the semiconductor pattern ACT1 of the first transistor T1. The sub-gate insulating layer GIS_2 may overlap at least the gate electrode 141 of the first transistor T1 and/or the channel region CH1 of the first transistor T1. In other words, the gate insulating film of the first transistor T1 may include the second gate insulating film GI2 and the sub-gate insulating film GIS_2. Further, the thickness between the gate electrode 141 of the first transistor T1 and the semiconductor pattern ACT1 of the first transistor T1 may be greater than the thickness between the gate electrode 142 of the third transistor T3 and the semiconductor pattern ACT3 of the third transistor T3. Accordingly, the driving characteristics of the first transistor T1 as a driving transistor may be improved while maintaining the switching characteristics of the third transistor T3 as a switching transistor.

Even in this case, the area of the plane in which the transistors T1 to T7 of one pixel may be disposed may decrease, and thus the display device may implement a higher resolution.

Figure 28:
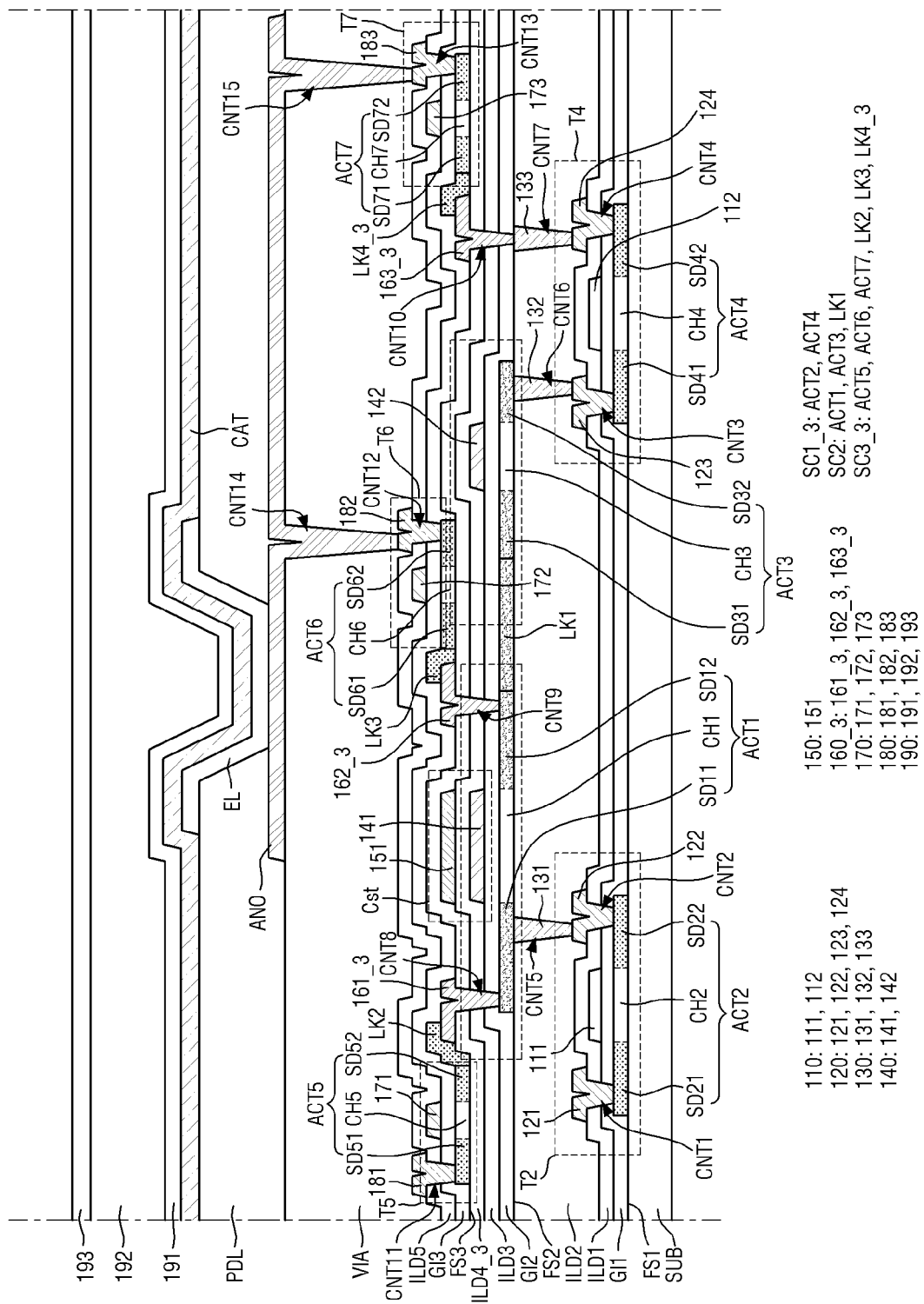
FIG. 28 is a schematic cross-sectional view of a pixel according to another embodiment.

FIG. 28 is a schematic cross-sectional view of a pixel according to another embodiment.

Referring to FIG. 28, a display device of the embodiment may be different from the display device of the embodiment of FIG. 5 in that each of the first semiconductor layer SC1_3 and the third semiconductor layer SC3_3 includes an oxide semiconductor.

Specifically, in the display device according to the embodiment, the second semiconductor layer SC2 including the semiconductor pattern ACT1 of the first transistor T1 and the semiconductor pattern ACT3 of the third transistor T3 may include polycrystalline silicon, monocrystalline silicon, amorphous silicon, or a combination thereof, whereas the first semiconductor layer SC1_3 including the semiconductor pattern ACT2 of the second transistor T2 and the semiconductor pattern ACT4 of the fourth transistor T4 and the third semiconductor layer SC3_3 including the semiconductor pattern ACT5 of the fifth transistor T5, the semiconductor pattern ACT6 of the sixth transistor T6 and the semiconductor pattern ACT7 of the seventh transistor T7 may include an oxide semiconductor.

A process for planarizing the third semiconductor arrangement layer FS3 may be unnecessary. For example, the third semiconductor arrangement layer ("FS3" in FIG. 5) on which the third semiconductor layer SC3_3 may be disposed may not be flat. The upper surface of the fourth interlayer insulating film ILD4_3 may have a step, and the upper surface of the fourth interlayer insulating layer ILD4_3 and the upper surface of the sixth conductive layer 160 may not be substantially on the same plane. Some of the fourth to sixth contact patterns 161_3, 162_3, and 163_3 may protrude toward the upper side of the fourth interlayer insulating layer ILD4_3.

The fourth contact pattern 161_3 and the semiconductor pattern ACT5 of the fifth transistor T5 may be electrically connected by the second semiconductor connection portion LK2_3, and at least a part of the second semiconductor connection part LK2_3 may be located on the fourth contact pattern 161_3. The fifth contact pattern 162_3 and the semiconductor pattern ACT6 of the sixth transistor T6 may be electrically connected by the third semiconductor connection portion LK3_3, and at least a part of the third semiconductor connection portion LK3_3 may be located on the fifth contact pattern 162_3. The sixth contact pattern 163_3 and the semiconductor pattern ACT7 of the seventh transistor T7 may be electrically connected by the fourth semiconductor connection portion LK4_3, and at least a part of the fourth semiconductor connection portion LK4_3 may be located on the sixth contact pattern 163_3.

Although it is shown in the drawing that the fourth contact pattern 161_3, the fifth contact pattern 162_3, and the sixth contact pattern 163_3 may be directly connected to the second semiconductor connection portion LK2_3, the third semiconductor connection portion LK3_3, and the fourth semiconductor connection portion LK4_3, respectively, the invention is not limited thereto. For example, the fourth contact pattern 161_3, the fifth contact pattern 162_3, and the sixth contact pattern 163_3 may be omitted. As another example, the fourth contact pattern 161_3, the fifth contact pattern 162_3, and the sixth contact pattern 163_3 may be electrically connected to the semiconductor pattern ACT5 of the fifth transistor T5, the semiconductor pattern ACT6 of the sixth transistor T6, and the semiconductor pattern ACT7 of the seventh transistor T7, respectively, by separate contact holes and conductive layers.

Further, although not shown in the drawing, a lower light blocking pattern may be further disposed under the first semiconductor layer SC1_3 and the third semiconductor layer SC3_3 each including an oxide semiconductor. The lower light blocking pattern may serve to prevent light incident from below from being introduced into the semiconductor patterns ACT2 of the second transistor T2, the semiconductor pattern ACT4 of the fourth transistor T4, and the semiconductor patterns ACT5 to ACT7 of the fifth to seventh transistors T5 to T7.

Even in this case, the area of the plane in which the transistors T1 to T7 of one pixel may be disposed may decrease, and thus the display device may implement a higher resolution.

In concluding the detailed description, those skilled in the art will appreciate that many variations and modifications can be made to the embodiments without substantially departing from the principles of the invention. Therefore, the disclosed embodiments of the invention may be used in a generic and descriptive sense only and not for purposes of limitation.

What is claimed is:

1. A display device, comprising:
an organic light emitting diode;
a first transistor that receives a data signal from a data line and controls a driving current to drive the organic light emitting diode;
a second transistor electrically connected to the data line and a first source or drain electrode of the first transistor, the second transistor transmitting the data signal received from the data line to the first transistor;
a third transistor electrically connected to a first power voltage line and the first source or drain electrode of the first transistor, the third transistor transmitting a first power voltage from the first power voltage line to the first transistor, wherein
  a semiconductor pattern of the first transistor is disposed over a semiconductor pattern of the second transistor, and
  a semiconductor pattern of the third transistor is disposed over the semiconductor pattern of the first transistor;
a lower transistor insulating film disposed between the semiconductor pattern of the first transistor and the semiconductor pattern of the second transistor; and
an upper transistor insulating film disposed between the semiconductor pattern of the first transistor and the semiconductor pattern of the third transistor.

2. The display device of claim 1, further comprising:
a fourth transistor electrically connected to a gate electrode and a second source or drain electrode of the first transistor,
wherein a semiconductor pattern of the fourth transistor is disposed between the semiconductor pattern of the second transistor and the semiconductor pattern of the third transistor.

3. The display device of claim 2, further comprising:
a sub-gate insulating film overlapping the gate electrode of the first transistor and not overlapping a gate electrode of the fourth transistor,
wherein a thickness between the gate electrode of the first transistor and a channel region is greater than a thickness between the gate electrode of the fourth transistor and a channel region.

4. The display device of claim 2, further comprising:
a fifth transistor electrically connected to the gate electrode of the first transistor and an initialization line, the fifth transistor transmitting an initialization voltage from the initialization line to the first transistor,
wherein a semiconductor pattern of the fifth transistor is disposed under the semiconductor pattern of the first transistor.

5. The display device of claim 4, further comprising:
a sixth transistor electrically connected to a second source or drain electrode of the first transistor and an anode electrode of the organic light emitting diode, the sixth transistor transmitting the driving current from the first transistor to the organic light emitting diode,
wherein a semiconductor pattern of the sixth transistor is disposed over the semiconductor pattern of the first transistor.

6. The display device of claim 1, wherein the semiconductor pattern of the first transistor, the semiconductor pattern of the second transistor, and the semiconductor pattern of the third transistor include a same material.

7. The display device of claim 6, wherein the semiconductor pattern of the first transistor, the semiconductor pattern of the second transistor, and the semiconductor pattern of the third transistor constitute a PMOS transistor including polycrystalline silicon.

8. The display device of claim 1, further comprising a capacitor including:
a first electrode electrically connected to a gate electrode of the first transistor; and
a second electrode electrically connected to the first power voltage line,
wherein the capacitor is disposed between the semiconductor pattern of the first transistor and the semiconductor pattern of the third transistor.

9. The display device of claim 1, wherein
the lower transistor insulating film includes a first interlayer insulating film disposed over the semiconductor pattern of the second transistor, and
an upper surface of the first interlayer insulating film is substantially flat.

10. The display device of claim 9, wherein
the upper transistor insulating film includes a second interlayer insulating film disposed over the semiconductor pattern of the first transistor, and
an upper surface of the second interlayer insulating film is substantially flat.

11. The display device of claim 1, further comprising a first contact pattern disposed between the semiconductor pattern of the first transistor and the semiconductor pattern of the second transistor,
wherein the semiconductor pattern of the first transistor and the semiconductor pattern of the second transistor are electrically connected through the first contact pattern.

12. The display device of claim 11, further comprising a second contact pattern disposed between the semiconductor pattern of the first transistor and the semiconductor pattern of the third transistor,
wherein the semiconductor pattern of the first transistor and the semiconductor pattern of the third transistor are electrically connected through the second contact pattern.

13. A display device comprising:
a first transistor, a second transistor, and a third transistor that are disposed on different layers, respectively;
a capacitor;
a first semiconductor layer disposed over a substrate and including a semiconductor pattern of the first transistor;
a first gate insulating film disposed over the first semiconductor layer;
a first conductive layer disposed over the first gate insulating film and including a gate electrode of the first transistor;
a first interlayer insulating film disposed over the first conductive layer;
a second semiconductor layer disposed over the first interlayer insulating film and including a semiconductor pattern of the second transistor;
a second gate insulating film disposed over the second semiconductor layer;
a second conductive layer disposed over the second gate insulating film and including:
  a gate electrode of the second transistor; and
  a first electrode of the capacitor electrically connected to the gate electrode of the second transistor;
a second interlayer insulating film disposed over the second conductive layer;
a third conductive layer including a second electrode of the capacitor disposed over the second interlayer insulating film;
a third interlayer insulating film disposed over the third conductive layer;
a third semiconductor layer disposed over the third interlayer insulating film and including a semiconductor pattern of the third transistor;
a third gate insulating film disposed over the third semiconductor layer; and a fourth conductive layer disposed over the third gate insulating film and including a gate electrode of the third transistor.

14. The display device of claim 13, wherein the second semiconductor layer is disposed on an upper surface of the first interlayer insulating film, and the upper surface of the first interlayer insulating film is substantially flat.

15. The display device of claim 14, further comprising a first contact pattern disposed in a first contact hole penetrating the first interlayer insulating film, wherein an upper surface of the first contact pattern and the upper surface of the first interlayer insulating film are disposed on a same plane.

16. The display device of claim 14, wherein the third semiconductor layer is disposed on an upper surface of the third interlayer insulating film, and the upper surface of the third interlayer insulating film is substantially flat.

17. The display device of claim 16, further comprising a second contact pattern disposed in a second contact hole penetrating the third interlayer insulating film, the second interlayer insulating film and the second gate insulating film, wherein an upper surface of the second contact pattern and the upper surface of the third interlayer insulating film are disposed on a same plane.

\* \* \* \* \*